United States Patent
Kojima et al.

(10) Patent No.: US 7,177,121 B2
(45) Date of Patent: Feb. 13, 2007

(54) MAGNETORESISTIVE SENSOR WITH RANDOM CRYSTAL ORIENTATION UNDERLAYER AND MAGNETIC DOMAIN CONTROL FILM CENTER ALIGNED WITH FREE LAYER

(75) Inventors: Shuichi Kojima, Fujisawa (JP); Norihiro Ookawa, Fujisawa (JP); Koji Okazaki, Fujisawa (JP); Yasunobu Yanagisawa, Fujisawa (JP); Akira Morinaga, Fujisawa (JP)

(73) Assignee: Hitachi Global Storage Technologies Japan, Ltd., Odawara (JP)

( * ) Notice: Subject to any disclaimer, the term of this patent is extended or adjusted under 35 U.S.C. 154(b) by 283 days.

(21) Appl. No.: 10/665,091

(22) Filed: Sep. 16, 2003

(65) Prior Publication Data
US 2004/0145836 A1    Jul. 29, 2004

(30) Foreign Application Priority Data
Sep. 25, 2002    (JP)    ............................. 2002-278326

(51) Int. Cl.
*G11B 5/39*    (2006.01)
(52) U.S. Cl. .................................. 360/324.12; 360/314
(58) Field of Classification Search ........... 360/324.12, 360/314
See application file for complete search history.

(56) References Cited

U.S. PATENT DOCUMENTS

| 4,663,685 | A | 5/1987 | Tsang | |
|---|---|---|---|---|
| 6,876,525 | B2* | 4/2005 | Lin et al. | 360/324.12 |
| 6,888,706 | B2* | 5/2005 | Ooshima | 360/324.12 |
| 2002/0051328 | A1* | 5/2002 | Hasegawa | 360/324.12 |

FOREIGN PATENT DOCUMENTS

| JP | 3125311 A | 5/1991 |
|---|---|---|
| JP | 2002151755 A | 5/2002 |
| JP | 2002170211 A | 6/2002 |

* cited by examiner

*Primary Examiner*—Craig A. Renner
(74) *Attorney, Agent, or Firm*—Townsend and Townsend and Crew LLP

(57) ABSTRACT

In a magnetoresistive head according to the present invention, a magnetic domain control film formed at the end of a free layer of a stack of magnetoresistive layers is formed of a Co alloy film, and an underlayer controlling the crystallization state of the Co alloy film and an amorphous metal film layer for controlling the crystallization state of the underlayer are disposed below the magnetic domain control film.

7 Claims, 17 Drawing Sheets

Enlarged view for portion A

Enlarged view for portion A

Enlarged view for portion A (a)

State A1

State A2

State A3

State B

State C (a)

(b)

MAGNETORESISTIVE SENSOR WITH RANDOM CRYSTAL ORIENTATION UNDERLAYER AND MAGNETIC DOMAIN CONTROL FILM CENTER ALIGNED WITH FREE LAYER

CROSS-REFERENCES TO RELATED APPLICATIONS

This application claims priority to Japanese application No. 2002-278326, filed Sep. 25, 2002, the disclosure of which is incorporated by reference.

BACKGROUND OF THE INVENTION

1. Field of the Invention

The present invention relates to a magnetoresistive sensor for reading information from a magnetic recording medium by utilizing a magnetoresistive effect and a magnetoresistive head constituted by including the magnetoresistive sensor. Further, the present invention relates, particularly, to a magnetoresistive head for use in a hard disk drive capable of reading at high recording density and relates to a structure of a magnetoresistive sensor for increasing the sensitivity of reading signals at high speed and high density recording and for attaining high signal reproducibility to improve the quality and a manufacturing method thereof. In particular, the present invention relates to a structure and a manufacturing method of a magnetic domain control film disposed in a magnetoresistive sensor for improving the sensitivity of a magnetoresistive sensor and attaining high signal reproducibility. According to the present invention, a magnetic head of high signal quality and reliability can be provided and a hard disk drive of high performance with low error rate can be provided by use of the magnetic head.

2. Description of Related Art

A magnetic head for use in a hard disk drive (HDD) comprises a writing head for recording information as magnetization signals into a magnetic recording medium (hard disk) and a reading head (sensor) for reading signals recorded as magnetization signals in the magnetic recording medium. Electric signals are converted by the writing head into magnetized information and recorded in the magnetic recording medium, while the recorded magnetized information is converted by the reading head into electric signals and taken out. In recent years, a magnetoresistive head of reading magnetized information by utilizing a magnetoresistive effect has been developed, which can read weak written magnetized information and attain a remarkable improvement on the recording density to greatly contribute to the information industry.

The sensor portion of the magnetoresistive head is composed of a stack of magnetoresistive layers comprising a plurality of magnetic thin films and non-magnetic thin films. The structure of the stack of magnetoresistive layers of the magnetoresistive head includes several types, which are classified, for example, into an AMR head, a GMR head and a TMR head based on the principle of magnet resistivity to be used. Input magnetic field information entered from the magnetic recording medium to the reading head is taken out as the change of voltage by utilizing the AMR effect (Magnetoresistive effect), GMR effect (Giant Magnetoresistive effect) and TMR effect (Tunnel Magnetoresistive effect), respectively.

The stack of magnetoresistive layers of the magnetoresistive head mainly comprises a magnetic layer referred to as a free layer that receives the input information magnetic field from the magnetic recording medium to conduct magnetization rotation, a pinned layer the magnetization direction of which is fixed by a coupling magnetic field of an anti-ferromagnetic body, and a non-magnetic layer put between them. Since the electric resistance of the stack of magnetoresistive layers changes in accordance with the change of the relation between the magnetization direction of the pinned layer and the magnetization direction of the free layer, when current is being supplied to the stack of electric resistant layers, a change in voltage according to the direction of the magnetization rotation of the free layer is generated and the direction of the magnetized information given to the free layer can be judged by observing the change in voltage. As described above, the reading head portion of the magnetoresistive head has a structure of functioning as a magnetic sensor by utilizing the magnetoresistive effective of the stack of magnetoresistive layers.

Since the magnetization direction of the pinned layer in the stack of magnetoresistive layers lowers the output signal intensity and allows the signal output to fluctuate when it is changed by the input signal magnetic field or other external magnetic field, the magnetization direction has to be fixed strongly by the coupling magnetic field of the anti-ferromagnetic body. For this purpose, an MnIr alloy thin film or MnPt alloy thin film having a strong coupling magnetic field is selected as the anti-ferromagnetic film, while a Co alloy film formed of a material having an intense coupling magnetic field or a stack of thin films thereof is selected as the pinned layer ferromagnetic film, and conditions for increasing the coupling magnetic fields are selected also for the thin film forming conditions. On the other hand, it is necessary that the magnetization of the free layer reacts sensitively to a weak external input magnetic field and has high reproducibility of the magnetization curve in accordance with plus, minus and zero of the external input magnetic field. For this purpose, an NiFe-Parmalloy alloy thin film or a Co series alloy soft magnetic film of excellent soft magnetic property, and a stack of thin films thereof are often used generally as the free layer. Also for the same purpose, materials and layer structures of the stack of magnetoresistive layers, as well as conditions and methods of manufacture have been studied and improved.

On the other hand, the Parmalloy thin film or the Co alloy thin film as the soft magnetic material used for the free layer are used in the sheet-like shape and they are used under application of induced magnetic anisotropy for attaining stable magnetization state even in a case where external input magnetic field is not present. However, it has been known that the soft magnetic thin films have no simple magnetic domain structure but form magnetic domain structures depending on the film thickness or the shape of the sheet. In particular, it has been known that circulation magnetic domain structures are formed at the end of the sheet-shape to generate disturbance in the magnetization direction, and the disturbed magnetic domain structures are changed by external magnetic fields. The noise generated due to by the change of the magnetic domain structures is referred to as Barkhausen noise which is generally known. In order to avoid the noise of the above mentioned type, a uniform bias magnetic field has to be applied to a sheet-like free layer to form a univalent magnetic domain structure so as not to generate circulation magnetic domains in the free layer. For this purpose, a permanent magnet is disposed at the end of the stack of magnetoresistive layers thereby generating and applying a bias magnetic field uniformly to the free layer. The system is known as a hard bias system and put to practical use. Further, it has been known an exchange bias system of forming an anti-ferromagnetic film on the free layer and applying a bias magnetic field by utilizing the exchange coupling between the free layer and the anti-ferromagnetic film. The hard bias system has been utilized for commercial use.

In the hard bias system, as shown, for example, in Japanese Patent Laid-open No. 3-125311, a magnetic domain control film comprising a magnet film is disposed on both ends of a free layer. The exchange bias system is a method of laminating an anti-ferromagnetic film on both ends of a long free layer and utilizing the exchange coupling between the anti-ferromagnetic film and the free layer as disclosed, for example, in U.S. Pat. No. 4,663,685.

Accordingly, the magnetoresistive sensor generally comprises, mainly, a stack of magnetoresistive layers in which a pinned layer or a free layer, or a pinned layer and a free layer are cut into a sheet-shape, and a magnetic domain control film having a permanent magnet film disposed on the end of a free layer cut into a sheet-shape for the magnetic domain control (hard bias system), or a magnetic domain control film of a system disposing an anti-ferromagnetic body on a free layer (exchange bias system), and an electrode film layer for supplying current to the stack of magnetoresistive layers.

A magnetoresistive sensor of the hard bias system is manufactured by a step of forming a stack of films for forming a stack of magnetoresistive layers, a step of coating a sheet-like resist which is well-defined for the size for forming a stack of magnetoresistive layers into a sheet-shape, a step of fabricating the stack of magnetoresistive layers into a sheet-shape, a step of forming a magnetic domain control film at the end of the free layer fabricated into the sheet-shape, a step of forming an electrode film layer, and a step of removing the resist coated for forming the shape. The magnetoresistive sensor of the exchange bias system is manufactured, for example, by a step of forming a stack of films for forming a stack of magnetoresistive layers, a step of forming an anti-ferromagnetic film on the surface of a free layer, a step of coating a sheet-like resist which is well defined for the size for forming a track width, a step of forming an electrode film layer, a step of removing the coated resist for forming the shape, a step of removing a portion corresponding to the track width of the anti-ferromagnetic layer, and a step of forming a protection film. In the case of the exchange bias system, the exchange coupling force applied to the free layer is weak and the track width has not yet been decided sufficiently in the process described above. In view of the present situation, developments of the material and structure for giving an intense coupling magnetic field and a manufacturing method have been required. Accordingly, the magnetoresistive sensor of the hard bias system is actually applied for commercial use at present.

As the permanent magnet film used for the magnet domain control film of the hard bias system, Co alloy series materials are used and those with addition of a Pt element have often been used. The Co series alloy thin films have hexagonal closed packed (HCP) crystal structure as the crystal structure and it has been well known that they have strong crystal magnetic anisotropy in the direction of the C axis and good permanent magnets showing high coercivity can be obtained easily. Further, addition of the Pt element to the Co series alloys increases the crystal magnetic anisotropy to show higher coercivity. It is further known that use of Cr or Cr alloy underlayer for the underlayer of the Co alloy thin film enables to control the crystallographic orientation of the Co alloy thin film by the hetero-epitaxy growing mechanism, thereby easily providing a permanent magnet film having higher residual magnetic flux density, coercivity and squareness. The techniques described above have been developed for the magnetic recording media.

Those used at present are magnetic domain control films of a stack structure of CoPt series alloy/Cr underlayer and they exhibit coercivity of about 2000 Oe and squareness of 0.8 or more. Further, there are those capable of providing coercivity of 3000 Oe or more by improvement of the material and optimization of the manufacturing conditions. The permanent magnet film of the magnet domain control film requires high coercivity since the magnetization state should not be changed by a signal magnetic field or an external input magnetic field. Since the input magnetic field is estimated to be about 600 to 800 Oe, it is possible that the coercivity of 1200 Oe, that is, at least 1.5 times thereof is necessary. Further it is possible that high values are required for the squareness and the coercivity squareness of the magnetization curve. When the squareness of the magnetization curve lowers, the residual magnetization lowers failing to provide a desired bias magnetic field efficiently to the free layer. The bias magnetic field applied to the free layer can be adjusted by changing the magnetic flux density of the permanent magnet film and changing the thickness of the permanent magnet film, while keeping high squareness, and optimization has to be done.

Generally, to conduct the magnetic domain control to the free layer in the stack of magnetoresistive layers, a magnetic field higher than a certain bias magnetic field has to be applied to the free layer. However, if the bias magnetic field is excessively intense, since the ferromagnetic body at the end of the free layer does not operate even when the signal magnetic field is inputted, a phenomenon of lowering the output occurs. For this reason, it is necessary to optimize the residual magnetic flux density or the film thickness of the permanent magnet film of the magnetic domain control film. Generally, the residual magnetic flux density is adjusted by changing the saturation magnetic flux density, that is, optimizing the alloy composition of the Co series alloy thin film. Further, the film thickness can be easily adjusted by changing the forming conditions and changing the forming time.

A sensor structure of a magnetoresistive head of a hard bias system in an existent structure is to be described with reference to FIG. 3. FIG. 3 is a schematic view showing a magnetoresistive sensor portion of a magnetic head taken along the cross section of the flying surface thereof. A stack of magnetoresistive layers is formed on a lower gap layer 2 formed on a lower shield 1. The lower gap layer 2 comprises a highly insulative material, mostly, an $Al_2O_3$ film. After forming an underlayer 3 for a stack of magnetoresistive layers, an anti-ferromagnetic layer 4, a pinned layer 5, a non-magnetic layer 6, a free layer 7 and a protection layer 8 successively on the $Al_2O_3$ gap layer 2, a resist is coated and the stack of magnetoresistive layers is fabricated into a sheet-shape by using the method of dry etching. In this process, the stack of magnetoresistive layers is dry etched as far as a lower portion thereof, that is, to the lower gap layer 2. The free layer width Twf as the track width is formed in this process. Subsequently, a magnetic domain control underlayer 10, a magnetic domain control film 11 and an electrode film 12 are formed continuously, and then the resist is peeled. Subsequently, an upper gap film 13 and an upper shield film 14 are formed. Among the forming steps described above, a method of forming the multi-layered thin film or forming the track width adopts a dry process, and the thin film is formed by a method usually referred to as sputtering, while the track width is formed by a method of ion milling. Further, when the stack of magnetic domain control layers 11 and the electrode film 12 are formed after forming the track width, they are formed by utilizing sputtered particles with stronger directionality by applying the ion beam sputtering method thereby optimizing the shape and the deposition of the magnetic domain control film 11.

The track width of the magnetoresistive head manufactured in accordance with the manufacturing method has been narrowed in recent years, and a resist refining technique or a technique of narrowing the size of the free layer has been developed. As shown, for example, in the Patent Document 1, application of a technique for forming a resist shape by electron beam exposure, improvement in the angle ($\alpha$) at the end of the free layer to 45° or more by considering the resist shape, or a consideration of decreasing the gap between the free layer and the magnetic domain control film has been taken in order to improve the magnetic domain controllability.

However, in the course of progress of high recording density in recent years, narrowing for the lateral size of the free layer is required and, it is found that when the size is reduced to 200 to 100 nm or less, there is a limit in the existent stack structure of magnetic domain control films and that improvement in the manufacturing method is still insufficient.

Output Lowering, Formation of Dead Area and Output Fluctuation

Generally, reading head output intensity is in a substantially linear relation with the track width thereof and, when the size of the track width is narrowed, output is lowered in accordance with the extent of narrowing. By the way, it is a well-known fact that the output lowers more than the lowering of the output caused by the narrowing of the track width when the track width is about 300 nm or less. This is because a dead area not generating magnetization rotation is formed at the end of the free layer by the intense bias magnetic field applied by the magnetic domain control film to form a portion not causing magnetization rotation and not contributing to the output. As a result of various experiments and simulations, the size of the dead area is as large as about 60 to 80 nm being converted as the track width. Accordingly, while the lowering of the output is about 20% at the track width of 300 nm, the lowering of the output is as much as 60% at the track width of 100 nm and the output can be obtained scarcely.

It has been well-known that the track width size of the dead area depends on the intensity of the bias magnetic field generated from the magnetic domain control film and the output is improved when the bias magnetic field is decreased. However, when the bias magnetic field is decreased, reproducibility of the output waveform becomes poor because of insufficient magnetic domain control for the free layer and fluctuation of the output waveforms is generated, as well as this results in phenomenon of generating irregular Barkhausen noise or irregular noise after operation of the writing head. When the noise of this type is generated, an error rate of reading of the magnetic recording information increases and the head can no longer be used.

In the prior art, it is probable that the bias magnetic field depends greatly on the shape of the magnetic domain control film at the end of the stack of magnetoresistive layers and the amount of residual magnetization (Brt: product of residual magnetic flux density Br and the magnetic domain control film thickness t). With the view point described above, to optimize the bias magnetic field for suppressing noise or fluctuation of the output waveforms, three methods are conducted for optimizing the bias magnetic field, i.e., making the angle at the end of the stack of magnetoresistive layers abrupt, controlling the Co alloy composition used as the magnetic domain control film to control the saturation magnetic flux density Bs of a Co alloy thin film, and controlling the thickness of the Co alloy thin film used as the magnetic domain control film, thereby controlling the amount of residual magnetization (Brt) to control the effective bias magnetic field applied to the free layer.

As a result of an experiment, it has been made apparent that an increase of the residual magnetic flux density of the magnetic domain control film and a decrease in the thickness of the magnetic domain control film at the end angle of the stack of magnetoresistive layers of 60° is effective in increasing the bias magnetic field applied to the free layer and decreasing the residual magnetization amount but it has found that the effect is limited. In the experiment described above, in a case of a free layer with 100 nm in track width, fluctuation of the output waveforms was generated and irregular Barkhausen noses were generated at the amount of residual magnetization (Brt) of the magnetic domain control film of about 25 Tnm or less. The track length of the dead area of the free layer in this case was 60 nm and the length of the dead area could not be decreased further. Accordingly, it has been found that the bias magnetic field cannot be optimized completely and there is a limit to the improvement of the head output characteristics by this system.

Problem of Shape

The cause includes a problem with the shape of the magnetic domain control film disposed at the end of the stack of magnetoresistive layers. FIG. 4 is a schematic view showing the shapes of, and the positional relationship between the magnetic domain control film and each of the free layer, the pinned layer and the shield film, as well as the state of magnetization. FIG. 4(c) corresponds to FIG. 3 for the existent structure and FIGS. 1, 2 showing the structure of the present invention correspond to FIGS. 4(b) and 4(a), respectively.

The method of decreasing the amount of residual magnetization of the magnetic domain control film can include a method of reducing the thickness of the Co alloy thin film of the magnetic domain control film. FIG. 4(c) shows the shapes of, and the positional relationship between the magnetic domain control film 11, and each of the free layer 7 and the pinned layer 5. When the thickness of the Co alloy thin film is reduced, the thickness is reduced at the inclined portion of the end of the magnetoresistive element and a step is formed in the film shape thereat and, when magnetization H is directed to the track width, a demagnetizing field Hd is generated in the inclined portion to weaken the effective bias magnetic field. It is usually intended to apply the bias magnetic field only to the free layer 7, but the magnetic field is dispersedly applied to the pinned layer 5 and the shield layer 1, in the shapes shown in FIG. 4(c) and it cannot be said to be a structure for appropriately applying the bias magnetic field to the free layer. Further, the magnetic domain control film formed at the inclined portion of the end of the stack of magnetoresistive layers has a shape of a thin film inclined from the magnetizing direction. In addition, it is probable that intense positive and negative magnetic charges are generated on the inside and the outside thereof to form the demagnetizing field Hd inside the ferromagnetic body of the inclined portion. The demagnetizing field weakens the bias magnetic field intended to generate and no appropriate magnetic field can be applied to the free layer 7. Further, the angle of inclination ($\alpha$) for the inclined portion at the end of the stack of magnetoresistive layers acts to weaken the magnetic charge density to weaken and disperse the bias magnetic field.

Further, the magnetic domain control film is formed by using a lift-off resist such that the thickness of and a portion near the top end of the magnetic domain control film 11 is generally reduced, and the top end formed thinly has a shape covering the upper surface of the free layer. It has been known that when the thickness of the Co alloy magnetic thin film is reduced to as thin as several nm, the magnetic characteristics thereof are lowered and the film becomes thermally instable. Accordingly, it is probable that the top end of the magnetic domain control film 11 also acts to disturb the bias magnetic field to be applied to the free layer 7.

It is considered that the magnetic domain control bias magnetic field should be applied to the free layer 7 and a magnetic field of higher intensity should be applied to the end of the free layer by a magnetic film whose vertical position is aligned with that of the free layer. In this case, it is expected that the bias magnetic field is applied more appropriately to the free layer 7 by adopting the structure of FIG. 4(b), that is, a structure as shown in FIG. 1 in which the vertical position of the free layer 7 is aligned with that of the magnetic domain control film 11.

Problem of Magnetic Characteristics

However, when a Co alloy magnetic thin film having a Cr underlayer used as the magnetic domain control film 11 is formed on an MnPt alloy thin film, MnIr alloy thin film, or on CoFe or NiFe used as a pinned layer of the stack of magnetoresistive layers, the magnetic characteristics thereof are deteriorated and the bias magnetic field cannot be applied to the free layer 7. That is, when a Co alloy thin film (magnetic domain control film 11)/Cr underlayer (magnetic domain control film underlayer 10) is formed on the thin film of the material used for the pinned layer 5, it resulted in a thin film having characteristics that the coercivity and squareness of the magnetization curve are lowered and the amount of residual magnetization cannot be maintained. As a result of various studies, this is attributable to that fitting is poor between the crystal system of the material constituting the stack of magnetoresistive layers and the crystal system of the Co alloy thin film/Cr underlayer (magnetic domain control film 11/magnetic control domain film underlayer 10) of good magnetic characteristics and, accordingly, a hetero-epitaxy mechanism results in a crystal structure of lowering the magnetic characteristics of the Co alloy thin film/Cr underlayer thin film when the Co alloy thin film/Cr underlayer are formed on the crystal system of the material constituting the stack of magnetoresistive layers.

While most of the layers of the stack of magnetoresistive layers are face-centered cubic (fcc) system polycrystal thin film, the Cr underlayer (magnetic domain control film underlayer 10) used as the magnetic domain control layer is a body-centered (bcc) polycrystal thin film, and the Co alloy magnetic film (magnetic domain control film 11) is a hexagonal closed packed (hcp) polycrystal thin film. The Cr underlayer (10) used as the underlayer for the Co alloy magnetic film is used for controlling the crystallographic orientation and the crystal inner strains of the Co alloy magnetic film hexagonal systems by the hetero-epitaxy crystal growing mechanism and, as a result, a Co alloy magnetic film having high coercivity and high squareness can be obtained. On the other hand, when the Cr underlayer and the Co magnetic film are formed on the face-centered-cubic lattice magnetoresistive element, the hetero-epitaxy crystal growing mechanism exerts between the stack of magnetoresistive layers and the Cr underlayer and, as a result, gives an undesired effect on the crystallographic orientation and the lattice strain of the Cr underlayer and the Co alloy magnetic film, to deteriorate the magnetic characteristics. It has been found that the thin film 5 of Co alloy thin film/Cr underlayer less shows good magnetic characteristics on the thin film constituting the stack of magnetoresistive layers.

On the other hand, when the crystal structure of the stack of magnetoresistive layers is formed into a better face-centered cubic (fcc) crystal structure, the magnetoresistive characteristics are improved. It has thus been found that the crystal structure of the stack of magnetoresistive layers cannot be changed.

The fact that the Co alloy thin film on the Cr underlayer cannot provide good magnetic characteristics on the thin film constituting the stack of magnetoresistive layers also shows that the portion on the inclined surface of the Co alloy magnetic domain control film at the end of the stack of magnetoresistive layers in the existent structure is in a crystal state of deteriorated magnetic characteristics. It is estimated that deterioration of the characteristics at the top end of the magnetic domain control film induces lowering of the bias magnetic field and disturbance of the bias magnetic field and it is probable that this constitutes a cause of deteriorating the magnetic domain control film properties.

The problem with the deterioration of the magnetic characteristics at the inclined portion cannot be solved even adopting the system of increasing the thickness of the Cr underlayer and aligning the vertical positions of the free layer and the magnetic domain control film as described, for example, in Patent Document 2. Further, in a case where the thickness of the Cr underlayer is increased, the thickness of the underlayer at the inclined portion of the end of the stack of magnetoresistive layers is increased to also result in a problem that the gap distance is enlarged between the free layer and the magnetic domain control film.

Accordingly, it has been found that when it is intended to form the structure by aligning the height between the free layer of the stack of magnetoresistive layers and the Co alloy thin film of the magnetic domain control film, the crystallographic orientation of the Co alloy thin film cannot be optimized and the magnetic characteristics as the permanent magnet layer are deteriorated, so that no appropriate bias magnetic field can be applied to the free layer.

That is, in the prior art, it is difficult to apply an appropriate magnetic field to the free layer while maintaining the magnetic characteristics of the magnetic domain control film. Further, the bias magnetic field is applied not only to the free layer but also to the pinned layer and, also in view of a strict consideration, the end of the pinned layer also undergoes the bias magnetic field of the magnetic domain control film to incline the magnetizing direction of the pinned layer, thus forming a dead area.

It is an object of the present invention is to provide, in a magnetoresistive sensor adopting a hard bias system, a structure capable of applying an appropriate magnetic field from a magnetic domain control film to a free layer, by controlling the crystal structure of a Co alloy magnetic thin film used as the magnetic domain control film and, forming and disposing the Co alloy magnetic thin film in an appropriate shape at the end of the stack of magnetoresistive layers. As a result, it is possible to decrease the dead area of the free layer, improve the signal output and, further, decrease the Barkhausen noise, output fluctuation and asymmetry in the output waveforms, thereby improving the signal quality during high recording density.

SUMMARY OF THE INVENTION

To solve the foregoing problems, it is preferred to form a Cr series alloy thin film used as a magnetic domain control film so as not to undergo the effect of the thin film crystal structure constituting a stack of magnetoresistive layers and make the crystal structure of the Cr series alloy thin film into a structure with a layered constitution capable of optimizing the crystal structure of a Co alloy thin film used as a magnetic domain control film. That is, in order not to undergoes the effect of the crystal structure of the thin film constituting the stack of magnetoresistive layers, it is preferred to form an amorphous metal thin film on the stack of magnetoresistive layers-thin-film and form a Cr underlayer and a Co alloy magnetic film on the amorphous metal thin film. Further, it is preferred to adopt a structure and a manufacturing method of selecting the material for the amorphous metal thin film, introducing an oxidation process and controlling the degree of the oxidation on the amorphous metal thin film thereby controlling the surface energy of the amorphous thin film to control the crystallographic orientation and the crystal grain size of the Cr alloy underlayer thin film. When a Co alloy magnetic film is formed on the Cr alloy thin film underlayer controlled with the crystal structure, the crystal structure of the Co alloy thin film can be optimized to obtain good magnetic characteristics. When the new amorphous metal thin film is formed between the stack of magnetoresistive layers and the magnetic domain control film, magnetic characteristics of the magnetic domain control film are improved and a structure capable of easily aligning the vertical positions of the free layer and the magnetic domain control film can be provided to localize and optimize the free layer bias magnetic field applied to the free layer.

Figure 1:
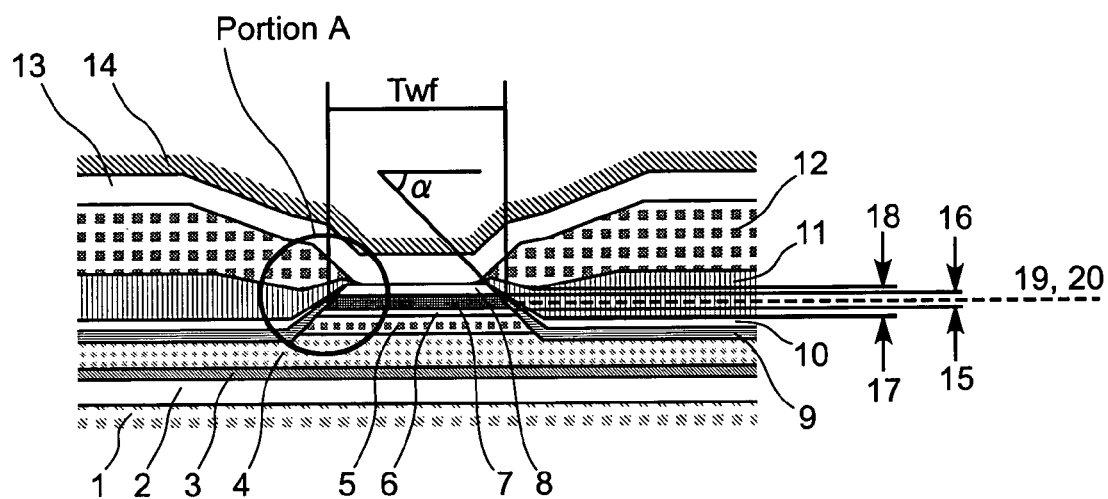
FIG. 1 shows the first embodiment of the present invention.
Figure 1:
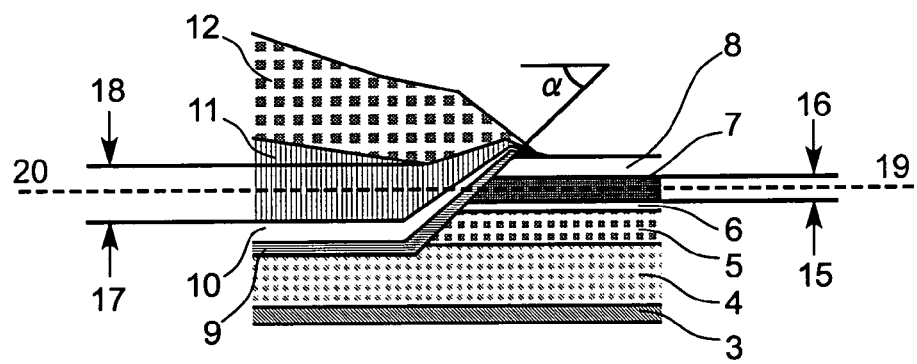

The following table includes a description of reference numerals.

| | |
|---|---|
| 1 | lower shield layer |
| 2 | lower gap layer |
| 3 | under layer of a stack of magnetoresistive layers |
| 4 | anti-ferromagnetic layer constituting a pinned layer |
| 4U | anti-ferromagnetic layer disposed on an upper portion of a free layer constituting a pinned layer |
| 5 | ferromagnetic layer constituting a pinned layer |
| 5U | ferromagnetic layer constituting a pinned layer disposed on the upper portion of a free layer |
| 6 | non-magnetic layer |
| 6U | non-magnetic layer disposed on the upper portion of a free layer |
| 7 | free layer |
| 8 | protection layer |
| 9 | magnetic domain control film amorphous layer |
| 10 | magnetic domain control film underlayer |
| 11 | magnetic domain control film layer |
| 12 | electrode film layer |
| 13 | upper gap layer |
| 14 | upper shield layer |
| 15 | vertical position of the lower surface of a free layer |
| 16 | vertical position of the upper surface of a free layer |
| 17 | vertical position of the lower surface of a magnetic domain control film at a position near the end of the stack of magnetoresistive layers |
| 18 | vertical position of the upper surface of a magnetic domain control film at a position near the end of the stack of magnetoresistive layers |
| 19 | central height of a free layer |

-continued

| | |
|---|---|
| 20 | central height of a magnetic domain control film at a position near the end of a stack of magnetoresistive layers |
| 21 | lower portion of lift-off resist |
| 22 | upper portion of lift-off resist |
| 23 | re-deposition film in ion milling step |
| 24 | re-deposition film in magnetic domain control layer deposition step |
| 34 | lower shield |
| 35 | insulative layer |
| 36 | stack of magnetoresistive layers |
| 37 | insulative layer |
| 38 | upper shield |
| 39 | insulative layer |
| 40a | lower magnetic pole |
| 40b | lower magnetic pole protrusion |
| 41a | upper magnetic pole 1 |
| 41b | upper magnetic pole 2 |
| 42 | coil |
| Portion A | end of a stack of magnetoresistive layers |
| Twf | track width of a free layer |
| α | angle at the end of a free layer |
| S | gap distance between end of free layer and a magnetic control film |
| Blank arrow H | magnetization direction of magnetic domain control film |
| Gray arrow Hd | demagnetization direction generated in magnetic domain control film |
| "+" and "−" symbols | magnetic charges generated due to tapered shape of magnetic domain control film |
| arrow | schematic view for magnetic fluxes generated from the end of the magnetic domain control film |

DESCRIPTION OF ILLUSTRATIVE EMBODIMENTS

Figure 3:
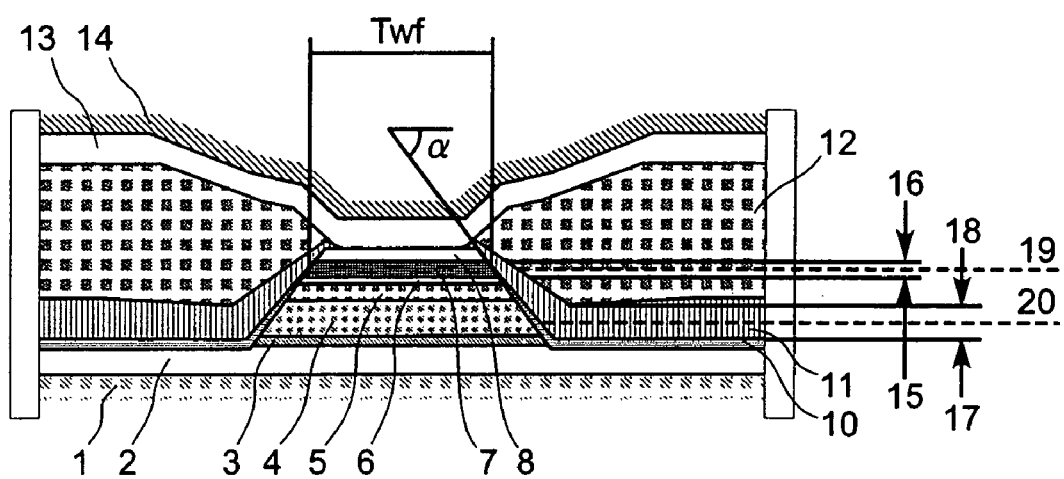
FIG. 3 is a view showing a cross sectional structure of a magnetic domain control film of a prior art.

FIG. 1 shows a schematic cross sectional structural view showing the structure of the present invention. In the existent structure (FIG. 3), the stack of magnetoresistive layers has a shape etched as far as the lower gap layer 2 by ion beam etching, whereas etching is conducted only as far as an anti-ferromagnetic layer 4 of a pinned layer 5 for aligning the respective vertical positions of a free layer 7 and a magnetic domain control film 11 in the structure of the present invention. For the ion beam etched surface of the stack of magnetoresistive layers, the surface of the anti-ferromagnetic body 4 constituting the pinned layer 5 is exposed, while the surface for each of the layers constituting the stack of magnetoresistive layers, that is, the fixed layer ferromagnetic layer 5, the non-magnetic layer 6, the free layer 7 and a protection layer 8 is exposed on an inclined surface, and a magnetic domain control amorphous layer 9 is formed on the exposed surfaces thereof. In this case, the amorphous thin film desirably has a structure of covering the surface of the inclined portion (refer to the lower view of FIG. 1). Then, the magnetic domain control under layer 10, a magnetic domain control layer 11 and the electrode film layer 12 are formed in the structure. Further, it is constituted in this case that the respective central heights 19, 20 of the free layer 7 and the ferromagnetic layer of the magnetic domain control film 11 formed to the end of the free layer are adjusted to identical or substantially identical levels. Further, it may also be constituted such that the central height 20 of the magnetic domain control film 11 is within a range from the lower surface height 15 and the upper surface height 16 of the free layer 7, or such that the central height 19 of the free layer 7 is within a range between the lower surface height 17 of the magnetic domain control film 11 and the upper surface height 18 of an indent near the stack of magnetoresistive layers.

Figure 2:
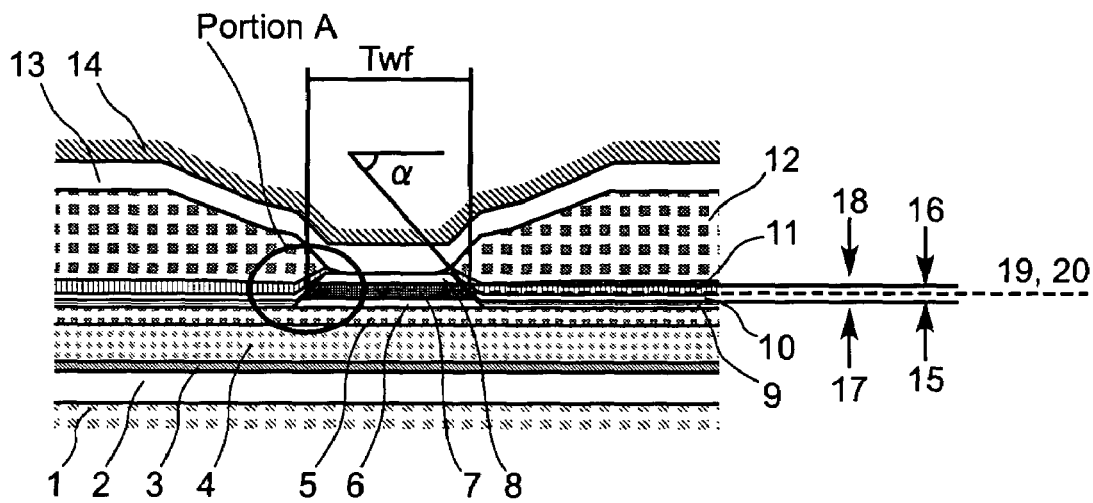
FIG. 2 shows the second embodiment of the present invention.
Figure 2:
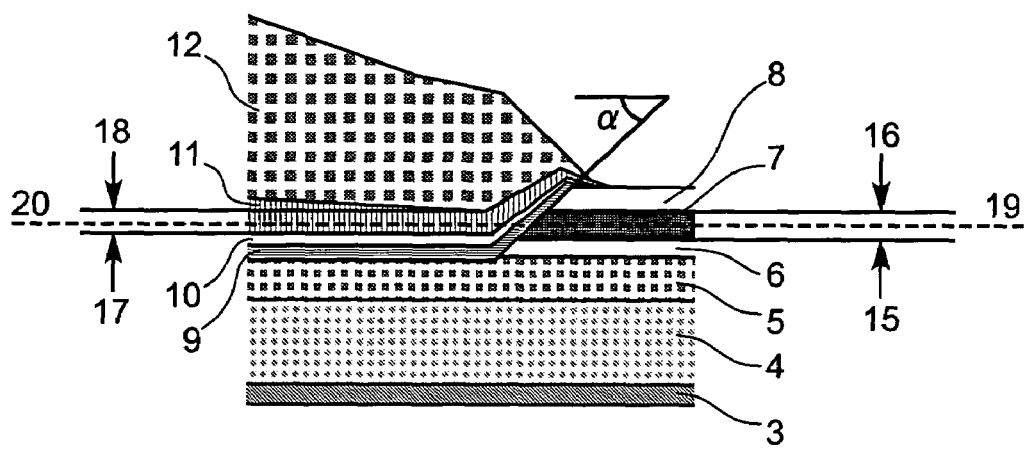

FIG. 2 is a view showing a structure that can be manufactured basically by the same order for the layer constitution which has a shape aligning the lower surface position 15 of the free layer 7 with the lower surface position 17 of the magnetic domain control film 11 and, further, a bias magnetic field is localized more by constituting the thickness of the magnetic domain control film 11 less than that of the free layer 7 thereby making it possible to apply a more appropriate bias magnetic field to the free layer 7. Further, this has the constitution corresponding to FIG. 4(a). A more desirable structure is obtained by controlling the composition of the Co alloy magnetic film used as the magnetic domain control film 11, thereby increasing the saturation magnetic flux density Bs of the magnetic domain control film 11 more than that of the material used for the free layer 7, and constituting the thickness of the magnetic domain control film 11 less than that of the free layer 7. An NiFe thin film is used for the free layer 7 and the saturation magnetic flux density Bs thereof is 1 T. For example, in a case of a CoCrPt alloy thin film, the saturation magnetic flux density can be increased to about 1.7 T by decreasing Cr and Pt compositions. As a result of an experiment, it has been found that a sufficient bias magnetic field can be obtained even at a thickness 0.75 times the thickness of the free layer 7. In this structure, compared with the structure shown in FIG. 1, the fixed layer ferromagnetic body is not etched in the ion beam etching step and the end is not exposed. Accordingly, less bias magnetic field is applied from the magnetic domain control film 11 to the pinned layer 5 while more bias magnetic field can be applied to the free layer 7. This is a structure preferable to that in FIG. 1.

When the amorphous thin film 9 is formed on the lower surface of the magnetic domain control film underlayer 10, a gap distance that is the sum of the film thickness of the Cr underlayer 10 and that of the amorphous thin film 9 (S in FIG. 4) is formed between the Co alloy magnetic film of the magnetic domain control film 11 and the end of the free layer. Since it is likely that the gap distance weakens the bias magnetic field, it is desirably constituted as small as possible. Therefore, the thickness of the Cr underlayer film 10 and that of the amorphous film are desirably constituted as thin as possible within a range that the magnetic characteristics of the Co alloy magnetic film are satisfactory.

The amorphous thin film 9 has to be selected from metal alloy thin films. As a result of various studies, it has been found that the foregoing object can be satisfied by forming an alloy amorphous thin film using Ni as a mother layer or Co as a motor layer and incorporating an additive element. It has been known that an amorphous film of Cr alloy thin film may sometimes be adopted. A technical subject as to what thin film is to be formed further on the lower surface of the Cr underlayer in order that the Co alloy thin film shows good magnetic characteristics is a technique developed in the course of the seed film formation of a thin film magnetic recording media. According to this, while the seed film constituted below the Cr underlayer should have an amorphous structure and it is considered that the constitution alone is still insufficient and selection of a material and an oxidation process to control the surface energy are also required. It of course depends on the forming condition upon thin film preparation. In the present invention, even when the amorphous film is formed on the face-centered cubic (fcc) thin film constituting the stack of magnetoresistive layers, materials for maintaining the amorphous structure and the manufacturing method have to be selected.

Further, with a view point that the magnetic domain control amorphous film 9 is a portion in which current flows to elevate the temperature, the additive element is preferably selected from high melting metals and the additive element is preferably selected from low resistance metals. Since current flows between the Co thin film of the magnetic domain control film 11 and the stack of magnetoresistive layers in an actual sensor structure, it is necessary that the electric resistance is as low as possible. Accordingly, the additive element is selected, for example, from P, Cr, Zr, Nb, Hf, In, Mo, Ti, V, Ta, W, Ru, Rh, Pd and Pt, and it is preferred that one or two or more of them are added to Ni or Co to provide a substantially amorphous structure. Preferably, the amorphous alloy has to be a composition of making the magnetic property of the Ni or Co film to that of non-magnetic property as an amorphous alloy.

It is considered that the effect of the element added to the Ni metal or Co metal is estimated that it not only changes the surface energy thereof but also gives a more effect on the formation of an initial growing layer upon crystal growth of the Cr alloy underlayer to change the crystal structure of the Cr underlayer 10 more intensely upon conducting the oxidation process after formation since it provides selectivity for atoms adsorbed on the surface of oxygen. Crystal system thin films of controlling the crystal growing orientation of the Cr alloy polycrystal thin film in the polycrystal thin film system other than the surface oxidizing the amorphous metal surface have not yet been known at present. This is estimated to be attributable to that the face spacing of Cr crystal is smaller than the face spacing of many other crystal materials but it is not certain at present.

Figure 6:
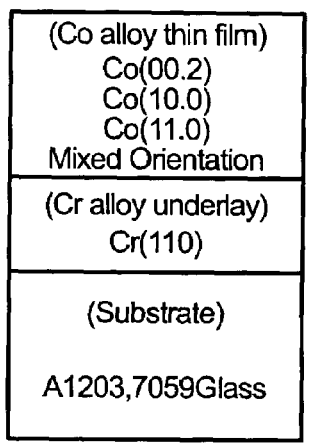
FIG. 6 is a schematic cross sectional view of a crystal orientation.
Figure 6:
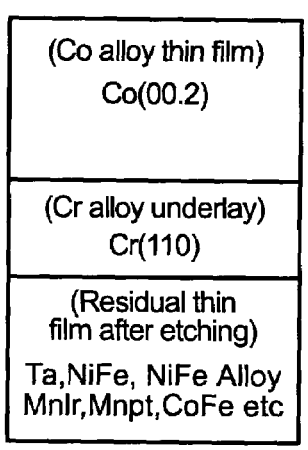
Figure 6:
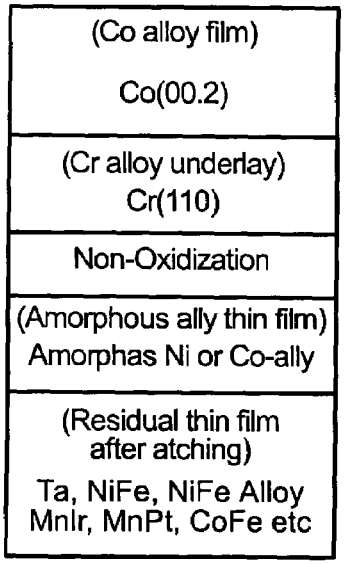
Figure 6:
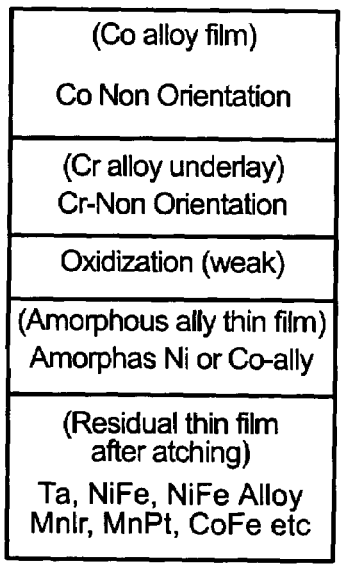
Figure 6:
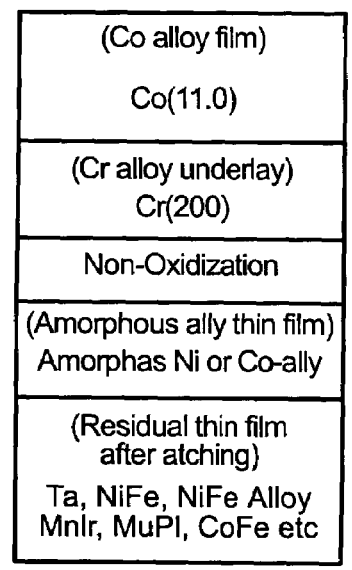

FIG. 6 schematically shows the relationship of crystal orientation faces when the amorphous alloy thin film is newly introduced. Generally, the crystallographic orientation of the Cr alloy thin film underlayer and the Co alloy thin film has an intense correlation with the orientation face relation by the hetero-epitaxy crystal growing mechanism. The Cr alloy film takes a body-centered cubic (BCC) crystal structure and Cr(110) orientation thin film and Cr(100) orientation thin film as the closed packed face have been known. When the Co alloy thin film is formed on the Cr(100) orientation thin film, it is known a case of Co(10.0) Co(00.1) mixed crystal orientation, a case of Co(10.0) Co(00.1) Co(11.0) mixed crystal orientation and Co(00.2) orientation, which change depending on the film forming conditions. It has been known that when the Co alloy thin film is deposited on the Cr(100) orientation thin film, it provides Co(11.0) orientation.

States A2 and A 3 in FIG. 6 show a state of Co(00.1) orientation on the Cr(100) orientation face, in which the C axis of the Co alloy thin film is oriented vertical relative to the film plane. Only the state of State A2 can be attained on the layer of most of face-centered cubic (fcc) system polycrystal thin film of the stack of magnetoresistive layers. State B in FIG. 6 shows a case of a Co alloy thin film isometrically oriented on the Cr underlayer. State C in FIG. 6 shows a case in which the Co(11.0) face is oriented to the Cr(100) orientation face in which the C axis of the Co alloy thin film is oriented in parallel relative to the film plane. Orientation of the Cr thin film can be changed as State A3, State B and State C by controlling the material of the amorphous alloy disposed below the Cr underlayer and the degree of oxidation of the surface thereof, and the C axis orientation of the Co alloy thin film can be changed from the direction vertical to the film plane to the direction in parallel thereto irrespective of the underlayer state before formation.

As a result of observing the magnetic operation of the free layer 7 by forming the magnetic domain control film 11 and the free layer 7 substantially at the same height and applying a bias magnetic field to the free layer 7, it has been found with respect to the crystallographic orientation of the Co alloy magnetic film that the coercivity is lowered and the magnetic operation of the free layer 7 is instable in the structure where the C axis of the hexagonal closed packed polycrystal structure is directed vertically relative to the film plane (FIG. 6: State A3) and the magnetic operation of the free layer 7 is instable in a structure where the C axis of the hexagonal closed packed polycrystal structure is directed in parallel relative to the film plane (FIG. 6: State C). That is, it has been found that the magnetic operation of the free layer is instable when the C axis crystal orientation of the Co alloy magnetic field of the magnetic domain control film 11 has a specified intense orientation relative to the film plane. It is generally considered that the C axis is preferably oriented within the film plane for increasing the bias magnetic field (FIG. 6: State C), but it is estimated that a portion with a reduced thickness at the top end of the magnetic domain control film 11 is present above the stack of magnetoresistive layers and, accordingly, magnetization by intense C axis orientation generates variations in the state of magnetization at the topmost end, so that the bias magnetic field applied to the free layer 7 is varied, making magnetic operation of the free layer instable. With the reason described above, the Co alloy magnetic film is preferably an isometric polycrystal thin film having no particular orientation of C axis (FIG. 6: State B), which is attained by neither Cr (110) face nor Cr(100) face of body-centered cubic lattice but by isometric orientation (FIG. 6: State B) of the Cr underlayer.

The present invention is based on the finding of the fact that the crystal state of the Co alloy thin film (magnetic domain control film 11) on the Cr underlayer can be controllably adjusted by using the amorphous alloy thin film 9. As a result, it has been found that the Co alloy thin film is most preferably in a state of the isometric orientation of State B or non-orientation.

By the application of the structure shown in FIG. 1 and the manufacturing process described above, it is possible to align the height of the free layer 7 with that of the Co alloy magnetic film of the magnetic domain control film 11 and apply an optimal bias magnetic field. Further, it is also possible to adjust the composition of the Co alloy magnetic film and increase the saturation magnetic flux density to localize an intense bias magnetic field and apply the same to the free layer 7. That is, as shown in FIG. 4(a) and in FIG. 2, the end of the stack of magnetoresistive layers is etched only to the surface of the fixed layer ferromagnetic body 5 or to the intermediate portion of the fixed layer ferromagnetic body 5 by ion beam etching, while leaving the fixed layer ferromagnetic film 5. The bias magnetic field should usually be applied only to the free layer 7 and, when the saturation magnetic flux density of the Co alloy magnetic film is increased and the thickness of the magnetic domain control film 11 is reduced to a thickness less than that of the free layer, it is possible to attain a structure capable of applying the bias magnetic field only to the free layer 7, which provides more preferred application system. The localization of the bias magnetic field can decrease the magnetic field intensity applied to the pinned layer 5 and eliminate the cause for forming the dead area.

Figure 5:
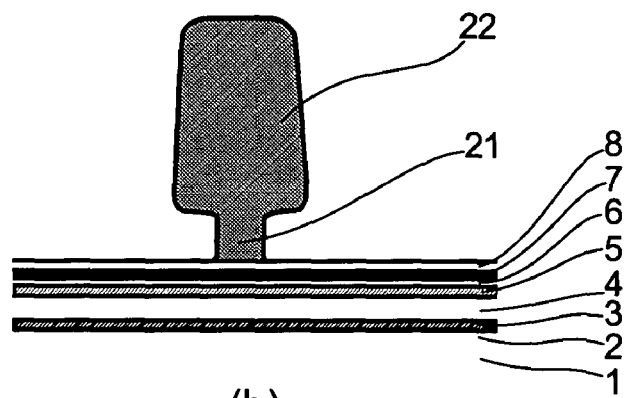
FIG. 5 is a view showing manufacturing process of a preferred embodiment of the present invention.
Figure 5:
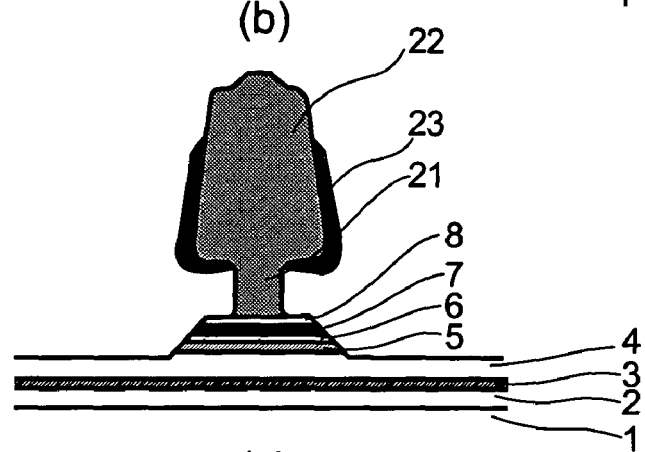
Figure 5:
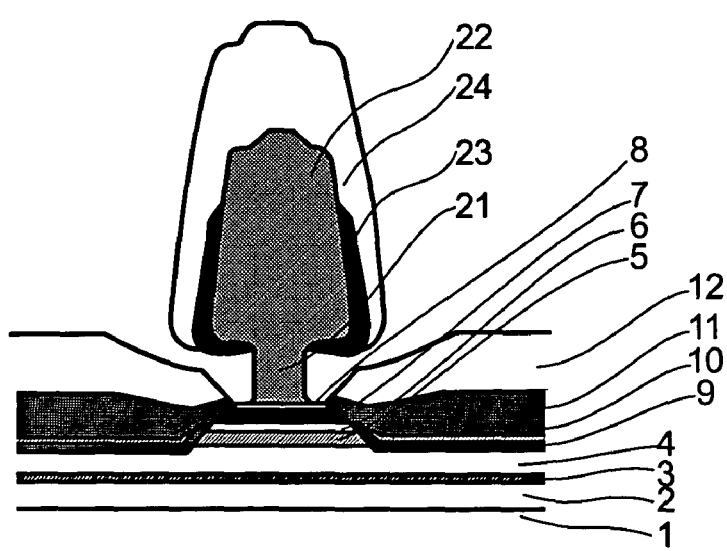

The structure described above can be formed by substantially the same manufacturing steps as those for the existent structure. FIG. 5 shows a schematic cross sectional view for manufacturing steps. A lift-off photoresist is coated and formed on a stack of magnetoresistive layers-thin film (FIG. 5(a)). The resist has a two-stepped structure in which the lateral size of a lower resist 21 is made narrower than that of an upper resist 22, so that the photoresist can be peeled and removed easily even after the formation of the magnetic domain control film 11 and the electrode film 12. Thus, even after the deposition of the magnetic domain control film 11 and the electrode film 12, a gap is formed between the deposition film formed on the resist and the deposition film formed at the end of the stack of magnetoresistive layers, which facilitates removal of the resist by the wet processing even after film formation. The track width of the stack of magnetoresistive layers is determined depending on the width of the upper resist.

Then, a portion of the magnetoresistive laminate thin film is etched and removed by the dry etching process. FIG. 5(b) shows a cross sectional shape after the etching treatment. For the dry etching method, an ion beam etching process is used and conditions capable of transferring the size of the track width of the upper resist to the shape after etching as exactly as possible and conditions capable of making the angle at the end of the free layer abrupt are selected. In the magnetic sensor of the existent structure, etching is applied as far as the $Al_2O_3$ layer of the lower gap layer 2 but etching is applied in the case of the structure of the present invention as far as the anti-ferromagnetic layer 4 constituting the pinned layer, or the ferromagnetic layer 5 constituting the pinned layer, or the non-magnetic layer 6. The etching depth is determined such that the height of the magnetic domain control film 11 is substantially aligned with the height of the free layer 7. Control of the depth position can easily be controlled by controlling the ion beam etching time. The depth of the ion beam etching can be made 3% or less within the plane of the substrate and between substrates by using, for example, a technique of applying etching while monitoring the etching depth by simultaneously conducting observation by SiMs analysis during ion beam etching to sufficiently ensure the reproducibility.

During ion beam etching, etched substances are deposited on the lateral side of the resist to form a re-deposition layer 23. Therefore, the size of the track width of the upper resist end does not completely agree with the track width of the free layer, and the angle of inclination at the end of the free layer is moderated by the re-deposition layer. The conditions of the resist size and the conditions of the ion beam etching are selected such that the angle of inclination at the end of the free layer becomes abrupt as much as possible. The angle at the end of the free layer 7 is preferably at a an acute high angle. It is desirable to conduct manufacture under the processing conditions such that the angle at the end is 45° or more. When the angle at the end is 45° or less, the angle at the end of the magnetic domain control film 11 is also decreased to 45° or less, by which the residual magnetic flux density is lowered, making it difficult to form an intense bias magnetic field.

Subsequently, a magnetic domain control film amorphous layer 9, a magnetic domain control film underlayer 10, a magnetic domain control film layer 11 and an electrode film layer 12 are formed continuously by using a sputtering process. FIG. 5(c) shows a schematic cross sectional view after forming the deposition films. The magnetic domain control film amorphous layer 9, the magnetic domain control film underlayer 10, the magnetic domain control film layer 11 and the electrode film layer 12 are preferably formed continuously and ion beam etching before formation is conducted preferably also in an identical vacuum. For this purpose, when the process is conducted by using an apparatus in which an ion beam etching apparatus and an apparatus for forming continuously magnetic domain control film amorphous layer 9, the magnetic domain control film underlayer 10, the magnetic domain control film layer 11 and the electrode film layer 12 are combined by a vacuum apparatus, not only a thin film with good magnetic domain control properties can be obtained but also the productivity is improved.

After forming the magnetic domain control film amorphous layer 9, a step of introducing an oxygen gas into a vacuum vessel and exposing the amorphous layer to an oxygen atmosphere is added in order to conduct oxidation for the surface thereof. The vacuum vessel needs only be additionally provided with a mechanism for introducing the oxygen gas and a mechanism for controlling exhaust. In a case where strong oxidation is necessary, oxidation can be controlled also by generating oxygen plasmas to form oxygen ions and exposing the amorphous surface to the oxygen plasmas.

The magnetic domain control film amorphous layer 9, the magnetic domain control film underlayer 10, the magnetic domain control film layer 11 and the electrode film layer 12 should be formed at the end of the free layer with the shape thereof well controlled. With the view point described above, the ion beam sputtering method is selected for the film deposition method. Since films are deposited by sputtering particles of higher directionality compared with a usual PVD (plasma vapor deposition) sputtering method, it is considered that film deposition to the end of the free layer can be controlled. Deposition conditions are selected at least for the amorphous film 9 and the underlayer 10 so as to sufficiently cover the end of the free layer. Further, the ion beam sputtering has a feature that the energy of sputtered particles, compared with the usual PVD (plasma vapor deposition) sputtering method, satisfactory crystals can be formed easily even at a room temperature deposition, and films with a smaller crystal grain size apt to form.

Then, the photoresists 21 and 22 are peeled and removed by a wet process. A gap is formed between the films at the end of the resist by the two-step lift-off resist to facilitate removal of the resist. After the removal of the resist, an upper gap layer 13 and an upper shield layer 14 are formed like the head of the existent structure, and a magnetoresistive sensor is manufactured.

The magnetoresistive sensor having the magnetic domain control film 11 of the present invention can be manufactured by the manufacturing method described above. Further, in the magnetoresistive sensor of this structure, since the ion beam etching is stopped at an intermediate portion of the stack of magnetoresistive layers, ion beams are not emitted to the lower gap layer 2 and, accordingly, ion beam damage to the lower gap layer 2 is not caused. In the existent structure, since the ion beams are emitted to the lower gap layer 2, the damage to the lower gap film 2 is caused to deteriorate the voltage withstanding characteristics. Accordingly, in the existent structure, the thickness of the lower gap layer 2 cannot be reduced to a level to impose a limit on the decreasing of the distance between the upper and lower shields. However, in the structure according to the present invention, a distance between the upper and lower shields can be reduced to a level to attain a structure suitable to the magnetic recording sensor of higher recording density.

The preferred embodiments of the present invention will now be described in more detail.

Embodiment 1

FIG. 1 shows a first embodiment of the present invention, showing a structure of an arrangement in which the central height of the free layer and the central height of a magnetic domain control film at a position near the free layer are aligned with each other by conducting ion milling as far as an intermediate portion of a pinned layer of a stack of magnetoresistive layers and controlling the height at which the ion milling is stopped, and in which the permanent magnet film properties of the magnetic domain control film can be improved by disposing the amorphous alloy film layer below the magnetic domain control film underlayer. While the cross sectional structure actually has a complicated curve, the structure is schematically shown by approximating the same to linear lines. Portion A is a joined portion between the end of the stack of magnetoresistive layers and the stack of films from the magnetic domain control under layer to the electrode film, and details for portion A specifically describe the structure.

The magnetic properties shown by a CoCrPt alloy thin film on a Cr underlayer on each of the layers used in a stack of magnetoresistive layers were examined. The results are shown by type A of No. 3 to No. 6 in Table 1. A stack of magnetoresistive layers-thin films were formed on 7059 glass substrates of Corning, etching was applied to each of Ta film, NiFe film, MnPt film and CoFe film, a Cr underlayer was formed by 5 nm on the surface thereof, and then a CoCrPt alloy thin film was formed by 20 nm. Etching was applied to each of the films and the magnetic properties in a case of forming a Cr underlayer (magnetic domain control film underlayer 10) and a CoCrPt alloy thin film (magnetic domain control film layer 11) are shown by type A of from No. 3 to No. 6 in Table 1. In this case, the Ta film and the NiFe film are stack of magnetoresistive layers-underlayer 3, and the underlayer has a two-layered structure in this example. Further, the MnPt film is an anti-ferromagnetic layer 4 constituting a pinned layer.

The CoFe film is a ferromagnetic layer 5 constituting a pinned layer. The ion beam sputtering method described in the manufacturing method above was used as the method of deposition. The ion beam etching was applied by an apparatus combined with the apparatus and ion beam sputtering was conducted about 7.5 min after the etching under vacuum of $1\times10^{-7}$ Torr or lower to form films. For comparison, the magnetic properties when they were formed on the $Al_2O_3$ film and the glass substrate are respectively described as No. 1 and No. 2 in Table 1. The thin film composition of the CoCrPt alloys was adjusted by using as a target 2.5 at % Cr composition and 14 at % Pt composition and selected such that the residual magnetic flux density exceeds 1 T (Tesla). For the magnetic properties, magnetization curve was measured under the application of external magnetic fields up to 10 KOe by VSM (Vibrating Sample Magnetometer) measured values and characteristic values were determined based on the magnetization curve.

For the magnetic properties of the CoCrPt/Cr film, the coercivity exceeded 2000 Oe, and the coercivity squareness exceeded 0.8 to show high residual magnetic flux density value in each case of forming on the glass substrate or on the $Al_2O_3$ film. On the other hand, the magnetic properties of the CoCrPt/Cr film formed on each of the layers of the stack of magnetoresistive layers-thin film showed remarkable lowering of coercivity value, coercivity squareness and residual magnetic flux density to deteriorate the permanent magnet characteristics compared with the case of deposition on glass or $Al_2O_3$ (refer to Type A of No. 1 to No. 6 in Table 1).

To confirm the effect of the amorphous film 9 of the present invention, the amorphous thin film 9 was formed on the substrate identical that those described above (Type A in Table 1) and on the thin film after ion beam etching, and then a CoCrPt/Cr thin film (magnetic domain control film 11/magnetic domain control film underlayer 10) was formed and magnetic properties were measured. The result is shown as Type B in Table 1. An NiTa thin film was selected as the amorphous thin film 9 and, after depositing the NiTa thin film and then exposure to atmospheric air to oxidize the surface, a CoCrPt/Cr thin film was deposited. The Ta composition in the NiTa thin film was 30 at % and it was previously examined that addition of Ta by 30 at % or more rendered the NiTa film to an amorphous thin film and to a non-magnetic thin film. Further, Ta was selected as the addition element because a broad peak intensity was observed by X-ray diffractiometry for the thin film with addition of Ta to Ni and the amorphous metal thin film 9 could be formed.

Further, in view of another investigation, it has been found that amorphous metals are formed by optimizing the addition amount and forming conditions when P, Cr, Zr, Nb, Hf, In, Mo, Ti, V, W, Ru, Rh, Pd, Pt, etc. are added to Ni or Co. Further, in view of another investigation, it has been found that a CoCrPt/Cr thin film formed on the amorphous film comprising, for example, NiP, NiZr, NiNb, NiHf, NiW, NiPd, CoZr, CoCrTa, CoCrNb, CrTi, etc. shows good magnetic properties.

TABLE 1

Magnetic Properties of CoCrPt/Cr Film on NiTa Amorphous Film

| No. | Type | Constitution of sample layer | Coercivity Hc (Oe) | Residual magnetization Br (KG) | Coercivity squareness S |
|---|---|---|---|---|---|
| 1 | A | CoCrPt/Cr/Al$_2$O$_3$ | 2250 | 10.3 | 0.88 |
|   | B | CoCrPt/Cr/NiTa/Al$_2$O$_3$ | 1850 | 10.5 | 0.83 |
| 2 | A | CoCrPt/Cr/Glass | 2200 | 10.5 | 0.89 |
|   | B | CoCrPt/Cr/NiTa/Glass | 1600 | 9.7 | 0.82 |
| 3 | A | CoCrPt/Cr/Ta/Glass | 800 | 6.5 | 0.65 |
|   | B | CoCrPt/Cr/NiTa/Ta/Glass | 1450 | 9.2 | 0.78 |
| 4 | A | CoCrPt/Cr/NiFa/Ta/Glass | 350 | 1.1 | 0.3 |
|   | B | CoCrPt/Cr/NiTa/NiFa/Ta/Glass | 1550 | 9.8 | 0.82 |
| 5 | A | CoCrPt/Cr/MnPt/NiFeCr/Ta/Glass | 820 | 4.2 | 0.35 |

TABLE 1-continued

Magnetic Properties of CoCrPt/Cr Film on NiTa Amorphous Film

| No. | Type | Constitution of sample layer | Coercivity Hc (Oe) | Residual magnetization Br (KG) | Coercivity squareness S |
|---|---|---|---|---|---|
|   | B | CoCrPt/Cr/NiTa/MnPt/NiFeCr/Ta/Glass | 1390 | 9.3 | 0.8 |
| 6 | A | CoCrPt/Cr/CoFe/MnPt/NiFa/Ta/Glass | 550 | 3.5 | 0.4 |
|   | B | CoCrPt/Cr/NiTa/CoFe/MnPt/NiFa/Ta/Glass | 1430 | 9.3 | 0.77 |

The magnetic properties of the CoCrPt/Cr thin film formed on the NiTa amorphous metal thin film showed slight lowering when formed directly on an $Al_2O_3$ thin film or glass substrate, compared with a case without the NiTa amorphous film but they still showed a high coercivity value of 1500 (Oe) or more (comparison between A and B for Nos. 1, 2 in Table 1). Further, the magnetic properties of the film when the NiTa thin film was formed on each of the layers of the stack of magnetic recording layers-thin film, that is, the Ta film, NiFe film, MnPt film, and CoFe film and then exposed to atmospheric air were better compared with a case without the NiTa amorphous film, showing high values as about 1400 (Oe) of coercivity and about 0.8 of coercivity squareness (refer to type B of No. 3 to No. 6 in Table 1).

To examine the cause of the change of the magnetic properties, crystallographic orientation of respective CoCrPt/Cr films was examined by X-ray diffraction θ-2θ method. It has been found that the Cr film formed on the glass and $Al_2O_3$ film showed Cr (110) orientation and the CoCrPt film (magnetic domain control film 11) thereon showed mixed crystal orientation of Co(00.2)Co(10.0)Co (11.0). On the other hand, an intense Co(00.1) peak was observed for the CoCrPt/Cr thin film formed on each of the layers of the stack of magnetoresistive layers-thin film to reveal a structure in which the C axis of the Co hexagonal closed packed crystal structure is intensely oriented in the direction vertical to the film plane. They correspond to the states of State A1 and State A2, respectively, in FIG. 6.

FIG. 6 is a schematic cross sectional view for explaining the state of crystal orientation based on X-ray diffractiometry for the magnetic domain control film and the magnetic domain control underlayer according to the present invention. Indication of the orientation face is in accordance with X-ray observation face.

State A1 shows a case in which crystal grains with the C axis of hexagonal closed packed lattice of a magnetic domain control Co alloy thin film are vertical and parallel relative to the film plane are mixed, with no predominant orientation to one of them.

State A2 shows a case where the C axis of a hexagonal closed packed lattice of the magnetic control Co alloy thin film vertical with respect to the film plane.

State A3 shows a case where the C axis of a hexagonal closed packed lattice of the magnetic control film Co alloy thin film vertical with respect to the film plane.

State C shows a case where the C axis of a hexagonal closed packed lattice of the magnetic control Co alloy thin film is parallel with respect to the film plane.

State B shows a case in which the C axis of the hexagonal closed packed lattice of the magnetic domain control film Co alloy thin film is oriented isometrically neither parallel nor vertical with respect to the film plane with no characteristic orientation. The situation of State B can be obtained by controlling the oxidation conditions for the surface of the magnetic domain control amorphous film.

In the case of Co crystals, it has been confirmed also experimentally on simulation that the crystal magnetic anisotropy thereof is in the direction of the C axis and were developed coercivity in the direction of the C axis. Since the crystal magnetic anisotropy is in the vertical direction by the orientation of the C axis of the Co crystal in the direction vertical to the film plane, the coercivity along the direction in the film plane is lowered. The crystal orientation of the CoCrPt/Cr thin film formed on the NiTa amorphous film is in the state of State C in FIG. 6 of Cr(200) Co(11.0), and it is probable that the C axis of the CoCrPt film is in parallel with the film plane and, accordingly, the direction of the crystal magnetic anisotropy is in the film plane to increase the coercivity within the film plane.

By the use of the NiTa amorphous film as the underlayer for the CoCrPt/Cr film, good magnetic properties of the CoCrPt thin film are obtainable even on the thin film in a state of stopping the ion beam etching at the intermediate portion of the stack of magnetoresistive layers-thin film. Thus, a reading head was prepared actually to demonstrate the properties. The read track width was 0.2 μm and the reading head was prepared by the manufacturing method described above. The residual magnetization of the magnetic domain control film 11 was set to 200 Gμm in this case. As a result, when the properties of the head were compared with those of a head of an existent structure having the same residual magnetization, substantially the same properties of the head could be obtained, with good head sensitivity, output fluctuation and noise properties, with no generation of Barkhausen noise. Further, while the CoFe film was used as the pinned layer 5 in this embodiment, good magnetic properties, head sensitivity and noise properties could be obtained in the same manner also in a case of using a pinned layer of a stacked ferri structure. Further, while an explanation has been made of the stack of magnetoresistive layers-underlayer 3 of the two-layered constitution, the same effect can be attained also with the three-layered constitution, which is within the scope of the present invention. Further, the ion beam etching depth is not restricted to the depth level at the underlayer 3, the anti-ferromagnetic layer 4 and the ferromagnetic layer 5 of the pinned layer in the stack of magnetoresistive layers, but good head properties can be obtained also at the level of the non-magnetic layer 6. Further, the depth may be at the intermediate position of each of the layers.

Embodiment 2

FIG. 2 shows a second embodiment of the present invention showing a structure of an arrangement in which the central height of the free layer and the central height of a magnetic domain control film at a position near the free layer are aligned with each other and a cross sectional structure in a case where the thickness of the magnetic domain control film is formed into a thickness less than that of the free layer. Portion A shows a joined portion between the end of the stack of magnetoresistive layers and the stack of films from the magnetic domain control underlayer to the electrode film, and details of portion A specifically describe the structure.

To demonstrate the effect of the present invention, the state of applying the magnetic domain control film bias magnetic field has to be evaluated specifically. To specifically evaluate whether the bias magnetic field of the magnetic domain control film 11 is properly applied to the free layer 7 or not, an external magnetic field was applied to operate the free layer 7 and a transfer curve as the magnetic resistance curve in this case was measured to conduct evaluation. The evaluation method is to be described.

Figure 7:
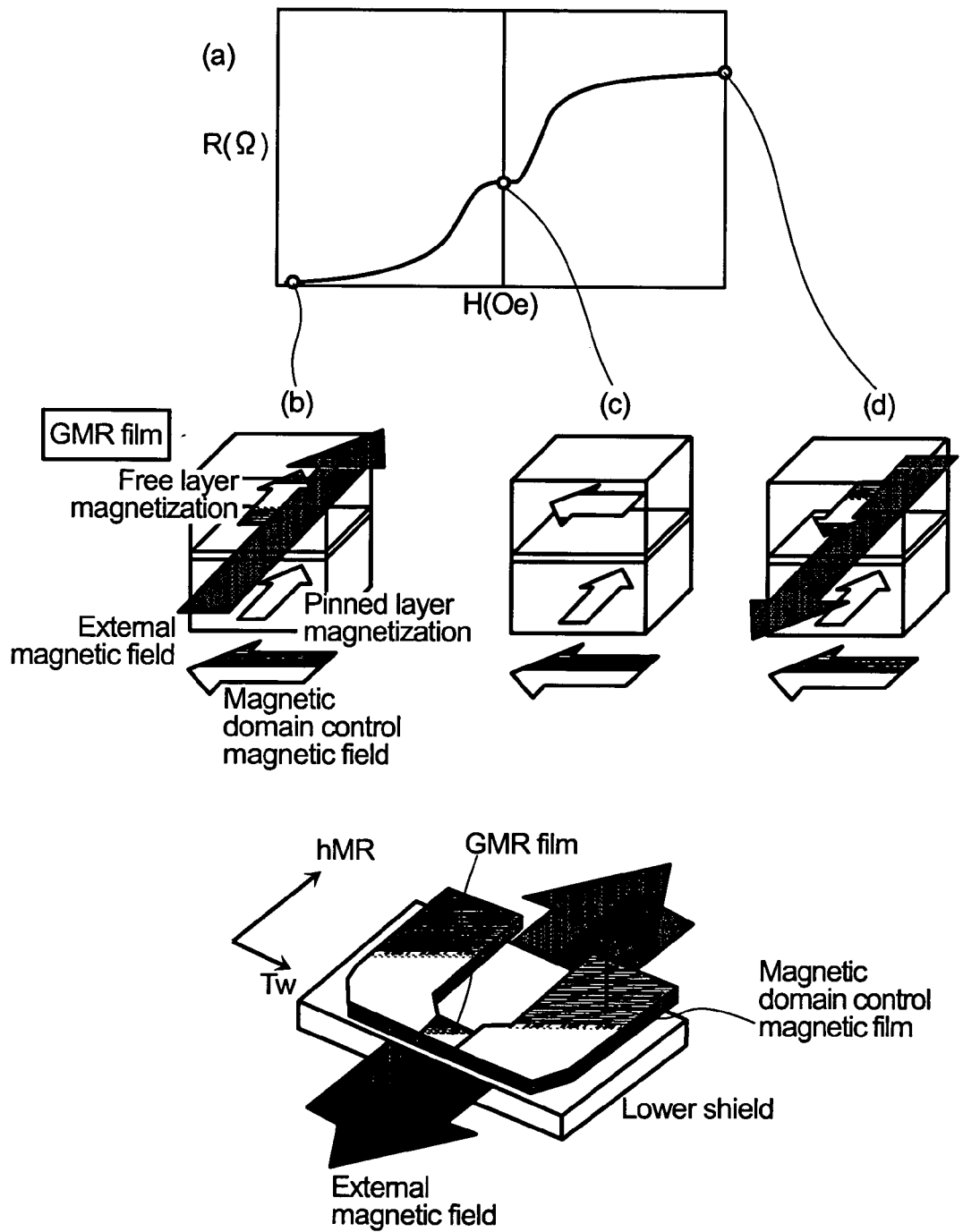
FIG. 7 is a view for explaining the operating principle of a magnetoresistive transfer curve measured for evaluating whether a bias magnetic field of the magnetic domain control film is appropriately applied to the stack of magnetoresistive layers or not in the embodiment of the present invention.

FIG. 7 shows the operating principle of the transfer curve. As the external magnetic field, an alternating magnetic field at ±700 (Oe) is applied in a direction (hMR direction) perpendicular to the direction of the track width (Tw direction) to measure the magnetic resistance. The example is shown as a ΔVH waveform in FIG. 7(a). In the actual measurement, reproducibility of waveforms has also to be taken into consideration and the ΔVH waveform is measured as an average of measurements made 30 times. The magnetic resistance is minimized when the magnetizing direction of the free layer is directed to the direction identical with the magnetizing direction of the pinned layer by the external magnetic field (FIG. 7(b)). The magnetic resistance is maximized when the magnetizing direction of the free layer is directed to the direction opposite to the magnetizing direction of the pinned layer by the external magnetic field (FIG. 7(d)). When the external magnetic field is zero or removed, the free layer has to be directed in a direction perpendicular to the magnetizing direction of the pinned layer by the magnetic domain control magnetic field (bias magnetic field) and the induced magnetic anisotropy added to the free layer (FIG. 7(c)). The magnetic resistance takes an intermediate value between the maximum and minimum values in this case.

Figure 8:
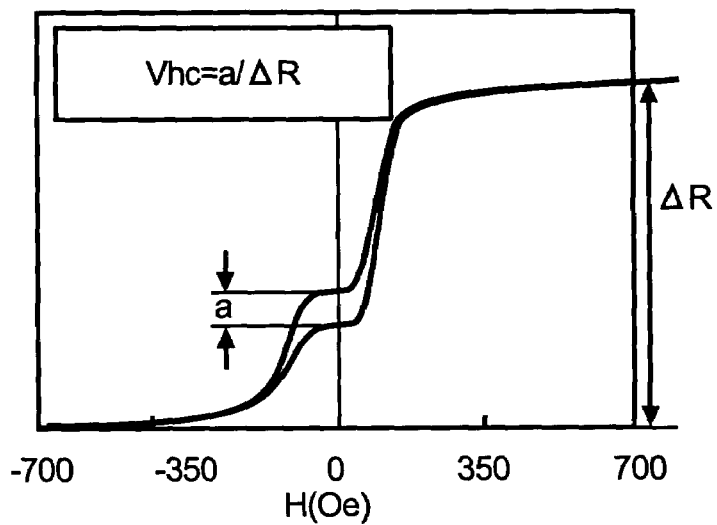
FIG. 8 is a view for explaining Vhc showing the amount of magnetic resistance change ΔR and the deviation of the transfer curve as the characteristic values of the transfer curve measured in the embodiment of the present invention.
Figure 8:
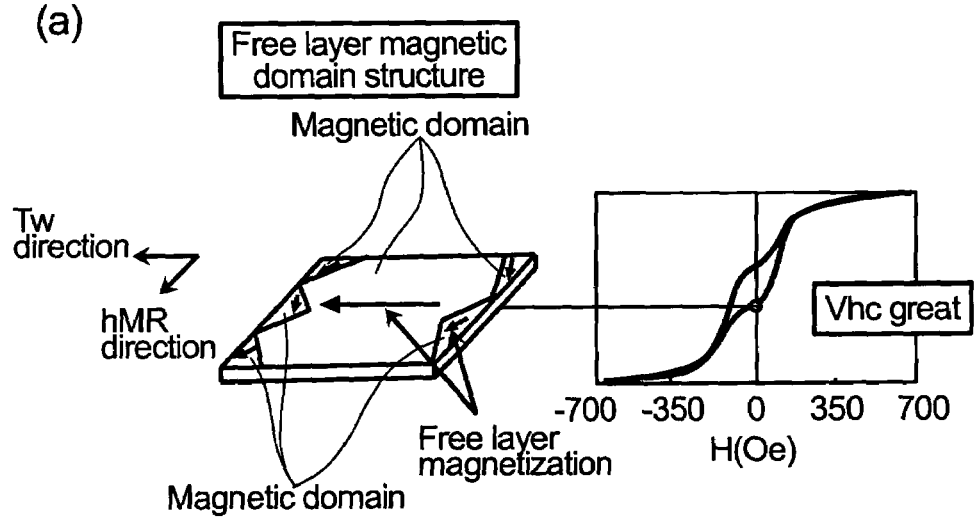
Figure 8:
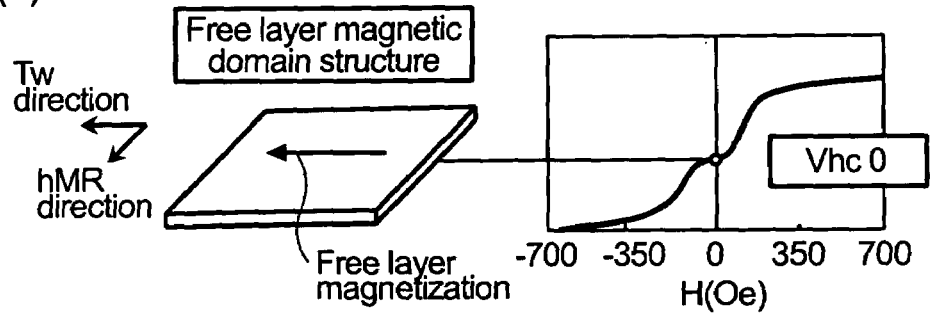

In a case where the magnetic domain control bias magnetic field applied to the free layer is insufficient or inappropriate, a deviation is caused in the waveforms near the zero magnetic field of the ΔVH transfer curve or the reproducibility of the transfer curve is lost. FIG. 8 shows the example. When hysteresis is generated in the magnetized state of the free layer near the externally applied magnetic field at zero, deviation due to the hysteresis is generated also on the transfer curve. Assuming the deviation as a and the change of the magnetic resistance as ΔR, the ratio Vhc=a/R is used as a characteristic value indicative of a degree of the deviation on the transfer curve. It has been well-known that in a case where the residual magnetization of the magnetic domain control film is small and thereby the bias magnetic field is insufficient, the manufacturing conditions for the free layer are not appropriate, or the magnetic properties of the magnetic domain control film are worsened, the deviation of the transfer curve increases. It is estimated that deviation is generated for the transfer curve, since the magnetic domain of the free layer takes a complicated magnetic domain state at the zero magnetic field because the magnetic domain control bias magnetic field is not appropriate (FIG. 8(a)). On the contrary, the transfer curve is closed when the magnetization state of the zero magnetic field of the free layer is univalent and has reproducibility.

On the other hand, Vhc and ΔR of the transfer curve substantially correspond to the output characteristic of the reading head when write/read operation is conducted on a magnetic recording medium as an actual magnetic head (head sensitivity, waveform fluctuation, etc.) and noise preparation. Those of small Vhc and less deviation of the transfer curve are excellent in noise properties. Accordingly, for the same stack of magnetoresistive layers, it can be evaluated whether the bias magnetic field is appropriate or not by the evaluation for Vhc.

Then, the oxidation process on the surface of the NiTa amorphous was investigated. In Embodiment 1, while the surface oxidation of the NiTa amorphous layer was conducted by a method of atmospheric exposure, an oxygen gas is introduced in a vacuum and the surface of NiTa amorphous is oxidized in an oxygen atmosphere in order to make the accuracy of the oxidation process higher in this case. In this method, the state of surface oxidation can be controlled easily by controlling the gas pressure of the oxygen atmosphere in a vacuum and exposure time of the NiTa amorphous film to the oxygen atmosphere.

Figure 9:
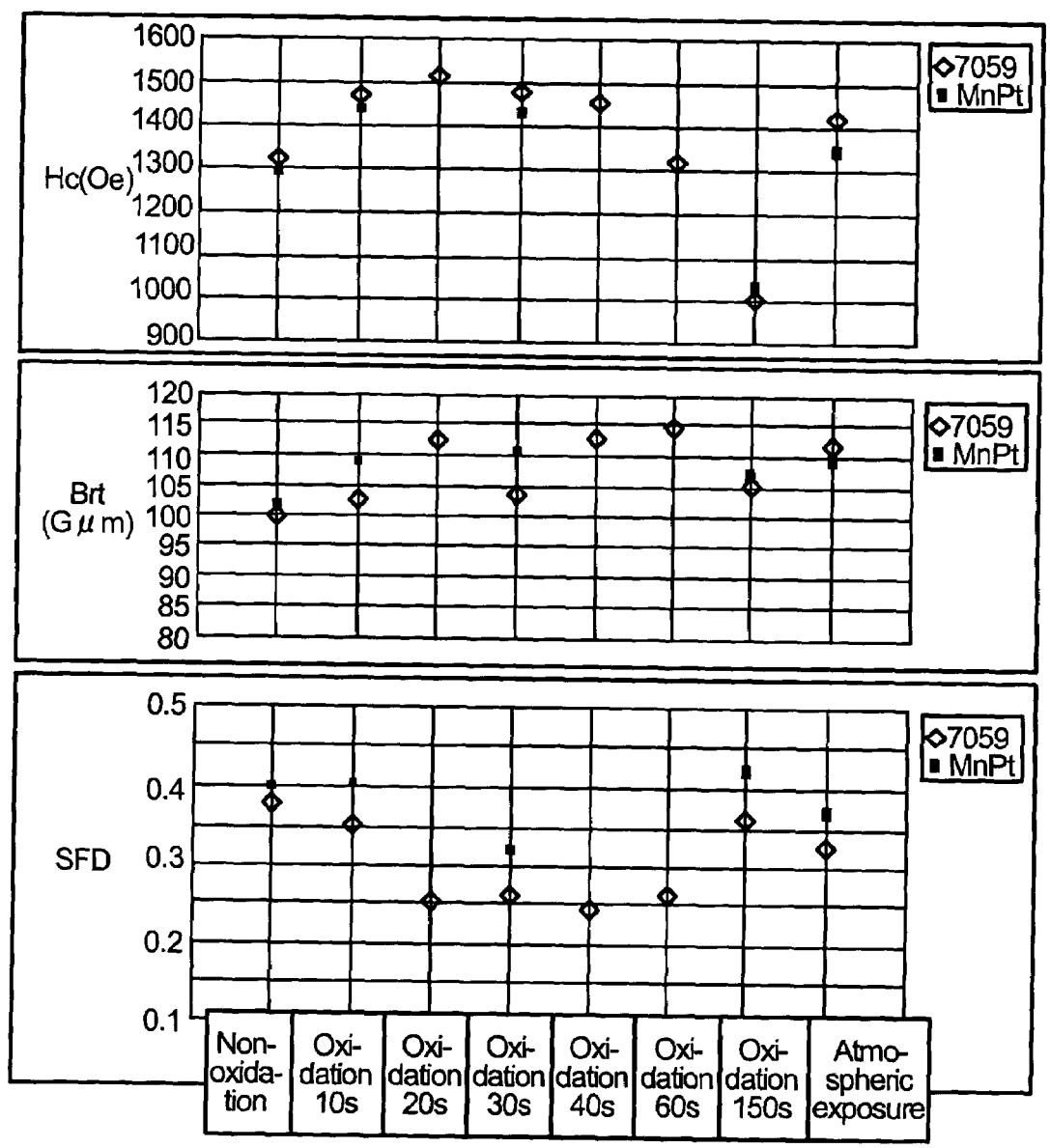
FIG. 9 is a graph showing the change of the static magnetic properties of the magnetic domain control film when the oxidation conditions on the magnetic domain control amorphous film are changed in Embodiment 2 of the present invention.

FIG. 9 shows the change of the magnetic properties when the exposing time to the oxygen atmosphere was changed. Thin films were formed under the same conditions as those for other thin film forming conditions in Embodiment 1, while changing the thickness of the NiTa amorphous film to 5 nm, the thickness of the Cr film to 5 nm and the thickness of the CoCrPt alloy thin film to 10 nm. As the oxygen atmosphere, a gas formed by mixing 10% $O_2$ in an Ar gas was introduced in a vacuum after forming the NiTa amorphous film. The gas pressure was set to 10 mTorr. Then, a CoCrPt/Cr film is formed. The magnetic properties are measured by a convenient type magnet meter and the squareness of the magnetization curve develops in SFD (Switching Field Distribution). When the squareness is higher, the SOD shows a lower value. The values for the coercivity Hc and the residual magnetization Brt are correlated with the measurement for VSM in which values calibrated for VSM measurement are used. Further, substrates were comparatively evaluated for 7059 glass substrates manufactured by Corning, and substrates formed by applying ion beam etching after forming a stack of magnetoresistive layers-thin film to expose an MnPt film as an anti-ferromagnetic film 4, on which were deposited an NiTa thin film as a magnetic domain control amorphous film 9 and a CoCrPt/Cr thin film after the oxidizing treatment.

The coercivity increases once as the oxidation time for the NiTa amorphous film increases and then the coercivity lowers as oxidation proceeds. At the oxidation time of 30 sec, the coercivity value is the highest as 1500 (Oe) and the SFD value shows the lowest value. There was no difference in the magnetic properties between those on the 7059 substrate and on MnPt. Under the oxidation condition in atmospheric exposure shown in Embodiment 1, the coercivity value shows a high value and the SFD value is also high.

Then, to confirm the effect of the present invention when the track is narrow, a head with decreased residual magnetization of the magnetic domain control film was prepared to evaluate the head properties. An investigation was conducted while setting the track width to 100 nm and the residual magnetization of the magnetic domain control film CoCrPt to 100 Gμm. The sample was prepared by using the preparing method described above. Conditions that were changed are collectively shown in Table 2. Ion beam etching was stopped at the instance the MnPt layer was over-etched by 2.5 nm. For comparison, those of the existent structure (sample #7), with no NiTa amorphous film and Cr underlayer (sample #6), and with no NiTa amorphous layer (sample #1) were prepared and evaluated for comparison. Further, as the surface oxidation conditions for the NiTa amorphous film, those conditions with no oxidation, oxidation for 30 sec, oxidation for 120 sec and atmospheric exposure were selected (samples #2, 3, 4 and 5). The magnetic properties under the conditions correspond to those of FIG. 9 in which the sample under the oxidation condition of 30 sec has the best magnetic properties.

Figure 10:
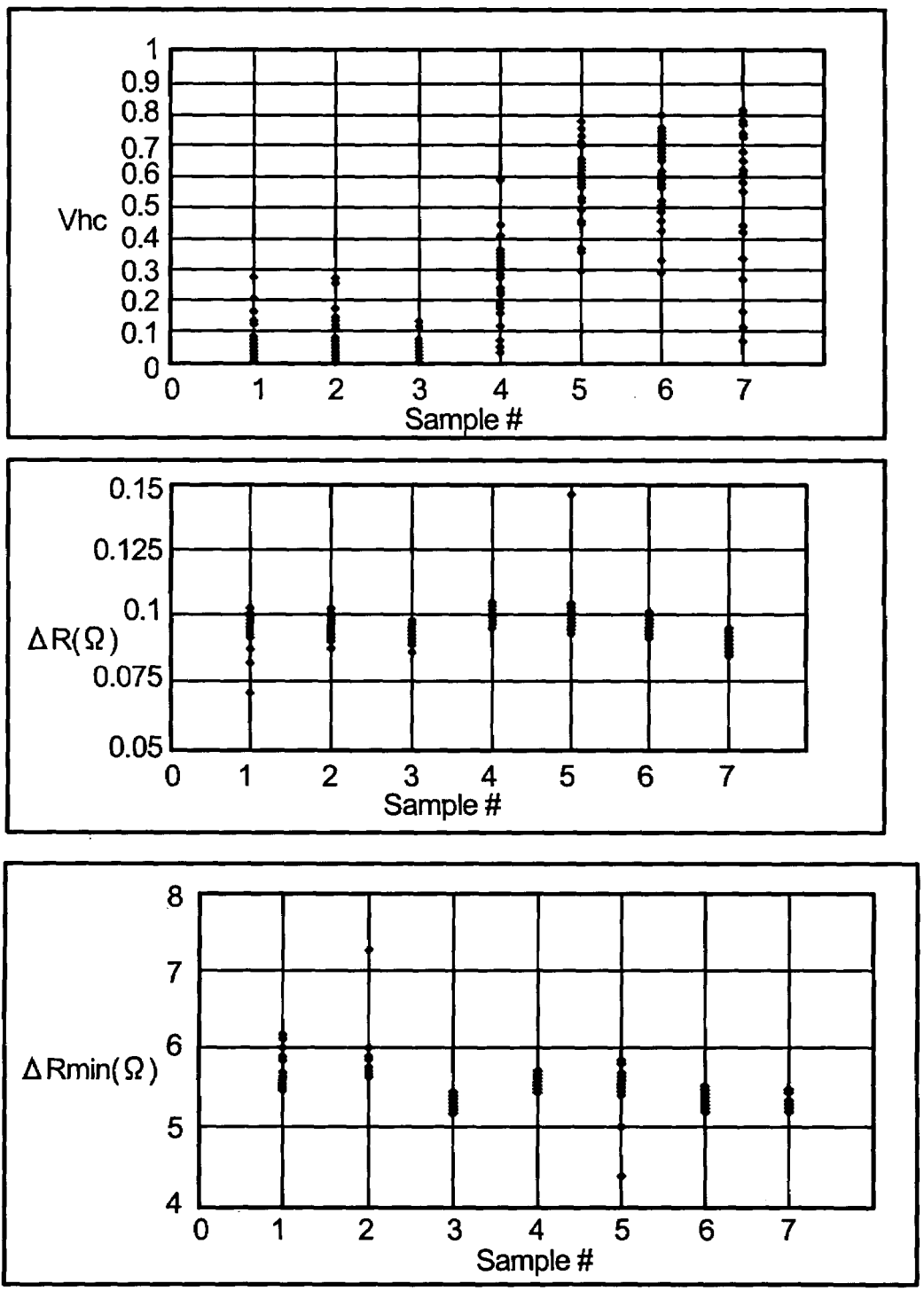
FIG. 10 is a graph showing the change of the characteristic values of the magnetoresistive transfer curve when the oxidation conditions on the magnetic domain control amorphous film are changed in Embodiment 2 of the present invention.

Reading heads were prepared under the conditions described above and the transfer curve was measured for evaluating the magnetic domain control bias magnetic field. The result is shown in FIG. 10. The resistance value R was substantially equal with that of the existent structure (sample #8). It can be seen that the Vhc value showing the intensity of the magnetic domain control bias magnetic field is lowest in the sample having the best magnetic properties under the oxidation condition for 30 sec to provide a good transfer curve. It can be seen that Vhc is high and the deviation is generated for the transfer curve in those of the existent structure (sample #7), with no underlayer (sample #6) and with no NiTa film (sample #1). Further, Vhc increases, regarding the surface oxidation condition for the NiTa film, in order of oxidation for 30 sec, with no oxidation, oxidation for 150 sec and atmospheric air oxidation.

In a case where the residual magnetization of the magnetic domain control film CoCrPt is reduced to 100 G$\mu$m, Vhc in the head of the existent structure (sample #7) is high. This is due possibly to the fact that the bias magnetic field is not appropriately applied to the free layer since the vertical positions of the magnetic domain control film and the free layer are greatly deviated from each other. Vhc is high of those with no NiTa magnetic domain control amorphous film and Cr underlayer (sample #6) and with no NiTa film (sample #1). This is due possibly to the fact that no sufficient magnetic properties of the magnetic domain control film CoCrPt are obtained even when the vertical positions of the magnetic control film and the free layer are aligned with each other and, therefore, a bias magnetic field is not appropriately applied to the free layer.

Figure 11:
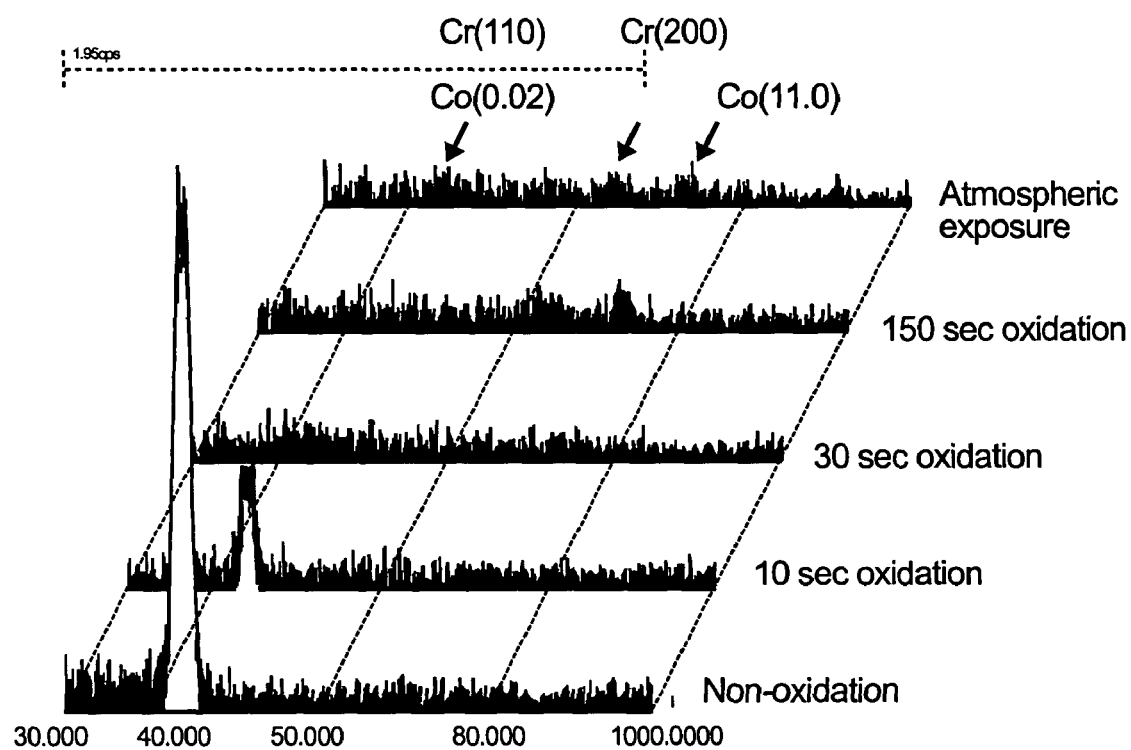
FIG. 11 shows X-ray diffraction waveforms when the crystallographic orientation of the magnetic domain control film and the magnetic domain control underlayer is examined by X-ray diffractiometry when the oxidation conditions on the magnetic domain control amorphous film are changed.

FIG. 11 shows waveform profiles of X-ray diffractiometry for CoCrPt/Cr thin films when the oxidation conditions of the NiTa amorphous film are changed. FIG. 11 shows diffraction waveforms in X-ray diffractiometry in which the waveforms of the NiTa thin film and the substrate are formed by subtraction as a difference so that the diffraction peaks for the CoCrPt/Cr thin film become distinct. The ordinate is in an arbitrary unit. The following can be seen. The crystallographic orientation of the CoCrPt/Cr thin film on the NiTa amorphous film shows Co(00.2)/Cr(110) orientation with no oxidation (State A3 in FIG. 6). The orientation intensity is once weakened as oxidation proceeds, X-ray Co(00.2)/Cr (110) orientation disappears under the conditions of oxidation for 30 sec (State B in FIG. 6). In addition, Co(11.0)/Cr(200) orientation is provided as the oxidation proceeds further (State C in FIG. 6). When oxidation proceeds further to atmospheric exposure, the degree of Co(11.0)/Cr(200) orientation (State C in FIG. 6) is weakened. To recognize the crystal state under the oxidation condition for 30 sec, the polycrystal state of the film was observed by TEM and, as a result, it has been found that this is a polycrystal state and the crystal grain size is 14 to 16 nm. It has also been found that the grain size decreases as the oxidation proceeds. Accordingly, it is probable that the state of the crystal orientation under the oxidation condition for 30 sec is not a polycrystal thin film having a specified crystallographic orientation relative to the film plane but an isometric polycrystal state.

In other words, by changing the oxidation conditions of the NiTa amorphous surface, the crystallographic orientation of the CoCrPt/Cr thin film can be changed from Co(00.2)/Cr(110) orientation (State A' in FIG. 6) to Co(11.0)/Cr(200) orientation (State C in FIG. 6), between which a polycrystal state of orientation isometric relative to the film plane is present as a transition state both for Co orientation and Cr orientation. The experiment described above shows that the magnetic domain control bias magnetic field can be applied most appropriately to the free layer 7 in a case of the isometric orientation. In view of other experiments, it has been found that the CoCrPt/Cr orientation may also be Co(10.0), Co(00.2), Co(11.0) mixed orientation/Cr(110), Cr(200) mixed orientation and that the Co alloy magnetic domain control film having no particular crystal orientation mainly has better magnetic domain control film properties.

TABLE 2

Content of Samples of NiTa Amorphous Film Investigated for Oxidation Conditions

| Sample # | Sample type | Ion beam etching Layer position for end point | NiTa amorphous layer Film thickness (nm) | NiTa amorphous layer Oxidation condition | Cr underlayer Film thickness (nm) | CoCrPt Film thickness (nm) |
|---|---|---|---|---|---|---|
| 1 | No NiTa film | MnPt layer 2.5 nm | none | none | 5 nm | 10 nm |
| 2 | No oxidation for NiTa surface | ↑ | 5 nm | ↑ | ↑ | ↑ |
| 3 | 30 sec oxidation for NiTa surface | ↑ | 5 nm | 30 sec | ↑ | ↑ |
| 4 | 150 sec oxidation for NiTa surface | ↑ | 5 nm | 150 sec | ↑ | ↑ |

TABLE 2-continued

Content of Samples of NiTa Amorphous Film Investigated for Oxidation Conditions

| Sample # | Sample type | Ion beam etching Layer position for end point | NiTa amorphous layer Film thickness (nm) | NiTa amorphous layer Oxidation condition | Cr under-layer Film thickness (nm) | CoCrPt Film thickness (nm) |
|---|---|---|---|---|---|---|
| 5 | Atmospheric exposure for NiTa | ↑ | 5 nm | about 60 sec in atmosphere | ↑ | ↑ |
| 6 | No underlayer | ↑ | none | none | none | ↑ |
| 7 | Existent structure | Al$_2$O$_3$ 2.5 nm | ↑ | ↑ | 5 nm | ↑ |

Usually, it is considered that an intense bias magnetic field can be obtained when the direction of C axis having the crystal magnetic anisotropy of Co crystals is directed to the direction of the magnetic field. The result of the experiments, however, shows that when the C axis is oriented within the film plane, Vhc increases, thus increasing variations. It is estimated that even when the heights of the free layer and the magnetic domain control film are aligned with each other as shown in FIG. 4(a), (b), the top end of the magnetic domain control film decreases in thickness and takes a shape overhanging on the free layer, and the dispersed scattering in the magnetization state at the top end increases by orientation of the C axis within the film plane, which increases Vhc. Alternatively, it is estimated that the crystal orientation within the film plane of the Co polycrystal thin film at the top end of the magnetic domain control film is dispersed and, when the C axis is oriented within the plane of the film, dispersed scattering in the magnetization state increases through the crystal grains at the top end, which increases Vhc. In the current technique, it is extremely difficult to control the amount of overhang describe above or control the direction of the Co polycrystal in the direction within the film plane. Accordingly, it is probable that the crystal orientation of the Co film at present provides a structure capable of obtaining better magnetic domain control bias magnetic field in a case of the isometric orientation shown by State B in FIG. 6, or Co(10.0), Co(00.2), Co(11.0) mixed crystal orientation of State of A1 in FIG. 6.

Then, reading head properties of the trial head of sample #3 in Table 2 was evaluated. As a result, a thin film head having output sensitivity properties of about twice that of the existent structure, and with less output fluctuation and less Barkhausen noise and read noise could be obtained. As a result of TEM (Transmission Electron Microscopy) observation for the cross sectional shape of the sample, the angle of inclination at the end of the free layer was from 45° to 55°. Also in the existent structure head, it has been known that the angle of inclination at the end of the free layer gives a significant effect on the bias magnetic intensity because of no application of a bias magnetic field to the free layer and it has been considered that at least 45° or more of the angle is necessary. While the angle at the end of the free layer of the head prepared by the identical process is about 65° to 75°, the angle at the end of the free layer of the head having the structure of the present invention is as small as about 45° to 55°, but it has been found that the structure can be applied with a sufficient bias magnetic field. However, the angle of inclination at the end of the free layer should be more abrupt.

In the existent structure, the residual magnetization of the magnetic domain control film could be decreased only to about 200 G·μm, but it can be lowered to 80 G·μm in the present invention and this can contribute by so much for the improvement of the sensitivity. Further, as a result of evaluation for the degree of the dead area, it has been found that this was 70 μm in the existent structure whereas it is decreased to one-half as about 40 nm in the present invention and it has been found that this is a technique essential for the narrow track reading head.

Embodiment 3

Figure 4:
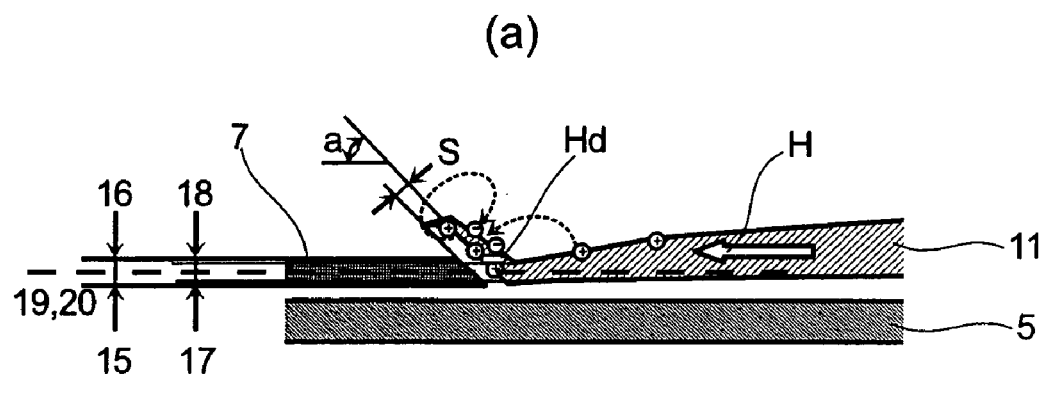
FIG. 4 is a schematic view of an end of a stack of magnetoresistive layers.
Figure 4:
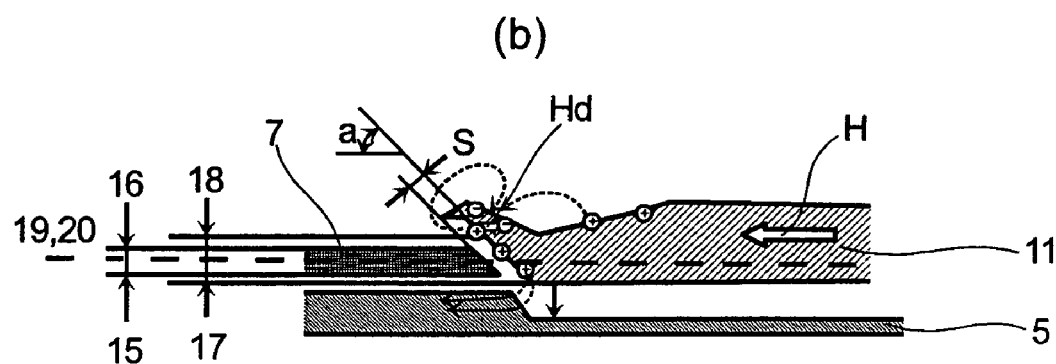
Figure 4:
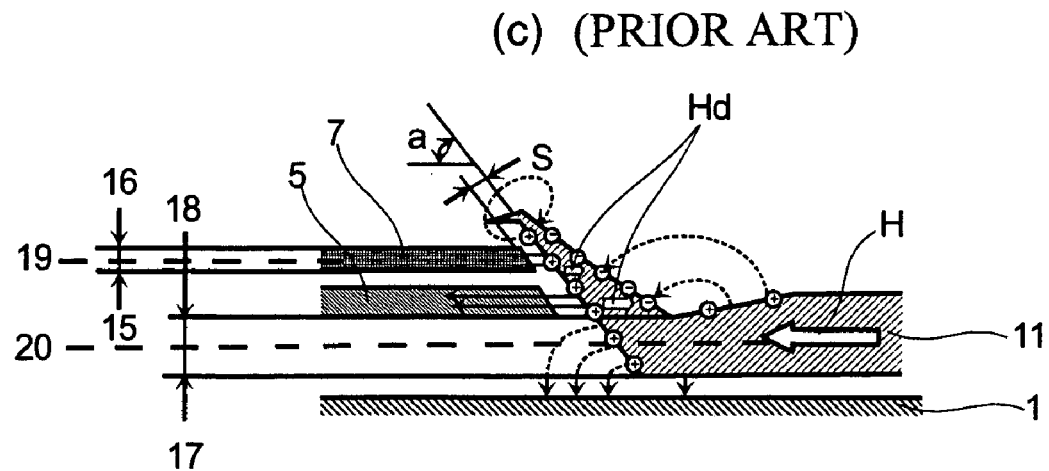

FIG. 4 is a view schematically showing a positional relation between a pinned layer ferromagnetic body, a free layer and a magnetic domain control film at the end of a stack of magnetoresistive layers and bias magnetic field magnetic fluxes. (a) is a view in a case of a structure corresponding to FIG. 2 which shows that the central height 19 of the free layer and the central height of the magnetic domain control film coincide with each other. (b) is a view in a case corresponding to FIG. 1, showing that the central height of the free layer and the central height 20 of the magnetic domain control film coincide with each other. (c) is a view in a case corresponding to an existent structure in FIG. 3 and showing that the central height of the free layer and the central height of the magnetic domain control film do not coincide with each other. Symbols "+" and "−" schematically show magnetic charges generated due to the tapered shape of the magnetic domain control film in the inclined portion at the end of the free layer. A blank arrow H represents a magnetization direction of the magnetic domain control film and a gray arrow Hd shows a demagnetizing field formed due to the tapered shape of the magnetic domain control film in the inclined portion at the end of the free layer. Symbol α represents an angle of inclination at the end of the free layer and it should be noted that the angle at the lower phase of the tapered shape in the magnetic domain control field of the inclined portion at the end of the free layer is an angle approximate to α. S represents a gap distance between the end of the free layer and the side of the magnetic domain control film. The angle at the tapered lower surface of the magnetic domain control film of the inclined portion at the end of the free layer and the gap distance S between the end of the free layer and the lateral side of the magnetic domain control film depend on the process for forming the magnetic domain control amorphous film and the magnetic domain control underlayer.

Next, the effect of the forming conditions of the NiTa amorphous film and the Cr underlayer on the magnetic properties of the magnetic domain control film and the head properties was examined.

Figure 12:
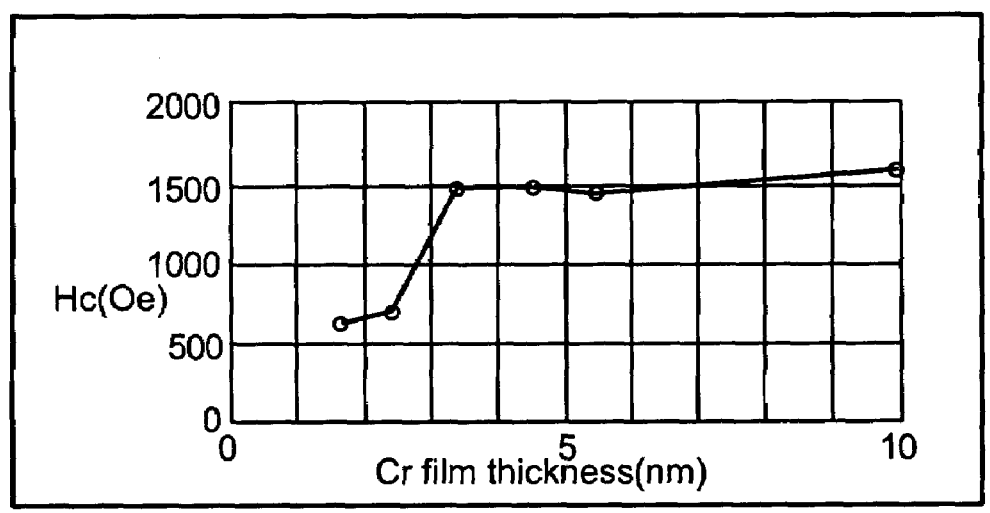
FIG. 12 is a graph showing the dependence of the magnetic properties of the magnetic domain control film on the thickness of the magnetic domain control film Cr underlayer in Embodiment 3 of the present invention.
Figure 12:
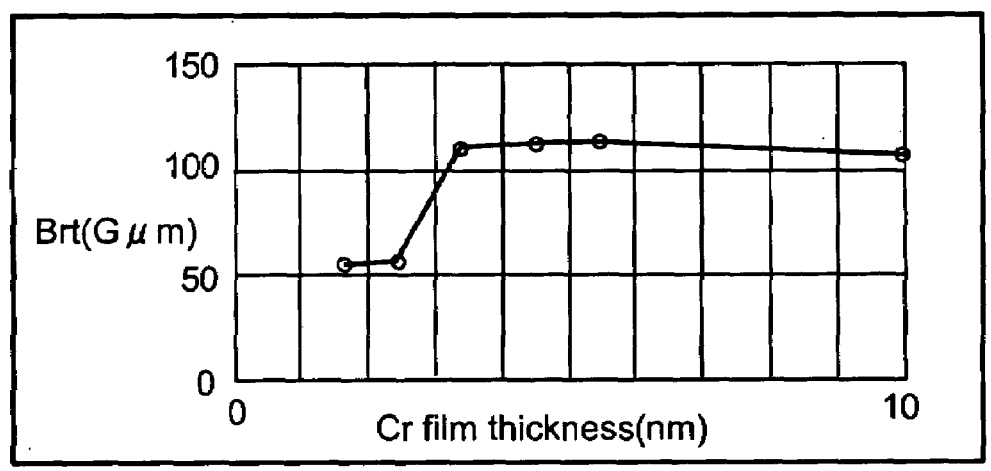
Figure 12:
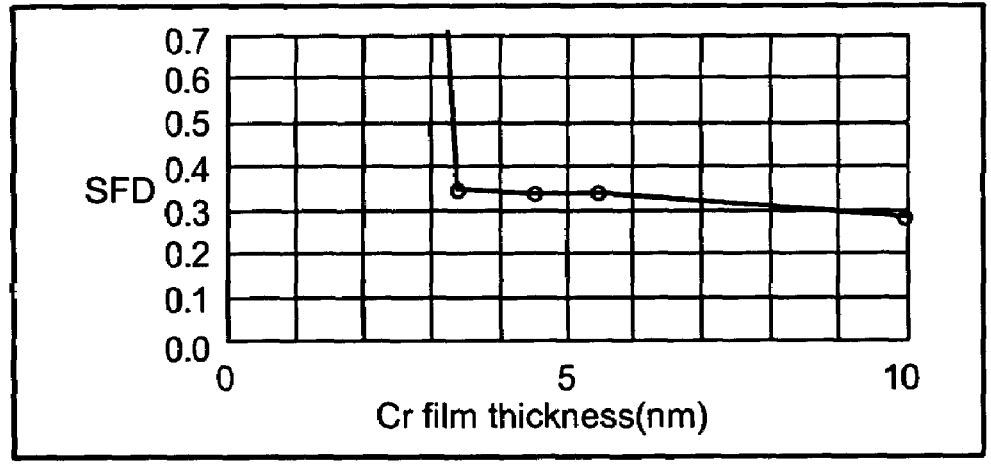

FIG. 12 shows the dependence of the magnetic properties on the Cr film thickness when the CoCrPt/Cr thin film is formed on the NiTa amorphous film. The thickness of the NiTa amorphous film is 5 nm, and, the oxidation time condition for 30 sec determined in Embodiment 2 is selected for the oxidation condition thereof. The thickness of the CoCrPt alloy film was 10 nm. A substrate was used which was prepared by forming a stack of magnetoresistive layers-thin film on a 7059 glass substrate and then etching as far as the MnPt film by ion beam etching. It has been found that the magnetic properties are deteriorated at the Cr underlayer thickness of 2.5 nm or less.

Figure 13:
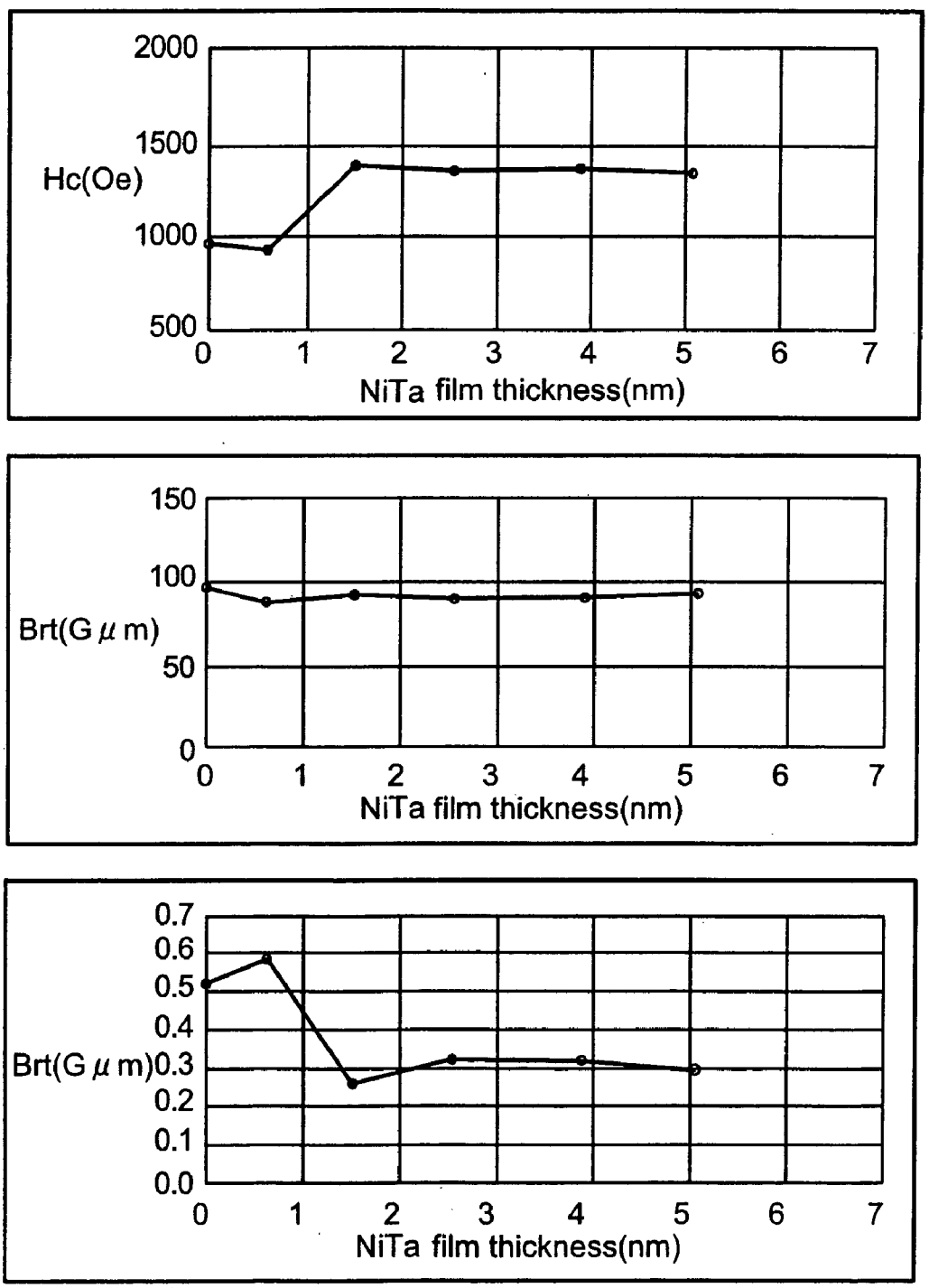
FIG. 13 is a graph showing the dependence of the magnetic properties of the magnetic domain control film on the thickness of the magnetic domain control film NiTa amorphous film in Embodiment 3 of the present invention.

FIG. 13 shows the dependence of the magnetic properties on the Nita amorphous film thickness when the CoCrPt/Cr thin film is formed on the NiTa amorphous film. The thickness of the Cr underlayer is 5 nm, and the oxidation time condition for 30 sec determined in Embodiment 2 is selected for the oxidation condition thereof. The thickness of the CoCrPt alloy film was 10 nm. A substrate was used which was prepared by forming a stack of magnetoresistive layers-thin film on a 7059 glass substrate and then etching as far as the MnPt film (an anti-ferromagnetic layer 4 constituting the pinned layer) by ion beam etching. It has been found that the magnetic properties are deteriorated at the thickness of the NiTa amorphous film 9 of less than 1.5 nm.

In a case where the NiTa amorphous film or the Cr underlayer is thin, when the orientation of Co crystals is examined, it shows intense orientation of Co(00.2) orientation and the C axis is directed to the direction vertical to the film plane and the coercivity, etc. are lowered. When the NiTa amorphous film or the Cr underlayer is thin, the crystallinity thereof is lowered and crystal orientation of the Co alloy magnetic film can no longer be controlled.

Since good magnetic properties can be obtained also when the thicknesses of the Ni amorphous film and the Cr underlayer are 1.5 nm and 2.5 nm, respectively, a head was prototyped under the condition for the underlayer thickness and the head properties were evaluated. While the average value of Vhc was 0.04 in the head under the condition of sample #3 in Embodiment 2, the sample reduced with the film thickness showed a value of 0.02 and a head of good reproducibility with the hysteresis deviation of the transfer curve was further decreased was obtained. This is because the gap distance between the free layer 7 and the magnetic domain control film 11 shown in FIGS. 4(a) and 4(b) is narrowed by reducing the thickness of the NiTa amorphous film and the Cr underlayer and more intense bias magnetic field is applied. It has been found that, to optimize the bias magnetic field, it is important to make the gap distance narrower between the free layer and the magnetic domain control film while keeping satisfactory the magnetic properties of the magnetic domain control film at the inclined portion of the end of the free layer.

Further, in the ion beam sputtering method used in the present invention, the thickness of the film formed at the inclined portion of the end of the stack of magnetoresistive layers can be changed by changing the incident angle of sputtered particles. As a result of an experiment while changing the incident angle of the sputtered particles in the ion beam sputtering method, it has been found that Vhc increases unless adopting conditions that the NiTa amorphous film and the Cr underlayer are deposited as far as around the lower portion at the top end of the CoCrPt thin film at the inclined portion of the end of the stack of magnetoresistive layers.

As shown above, by optimizing the conditions for forming the NiTa amorphous film and the Cr underlayer, the magnetic domain control bias magnetic field can be optimized, improving the head properties.

Embodiment 4

Figure 14:
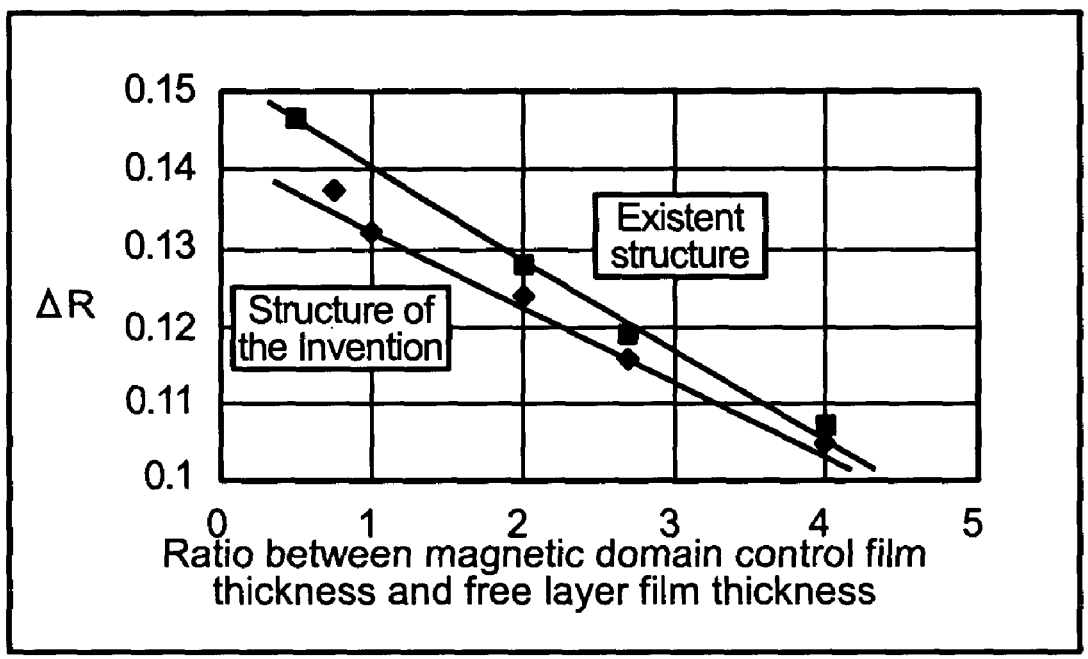
FIG. 14 is a graph showing the change of the characteristic value of the magnetoresistive transfer curve when the thickness of the magnetic domain control film is changed in Embodiment 4 of the present invention. It shows cases of application of the structure according to the present invention and the existent structure.
Figure 14:
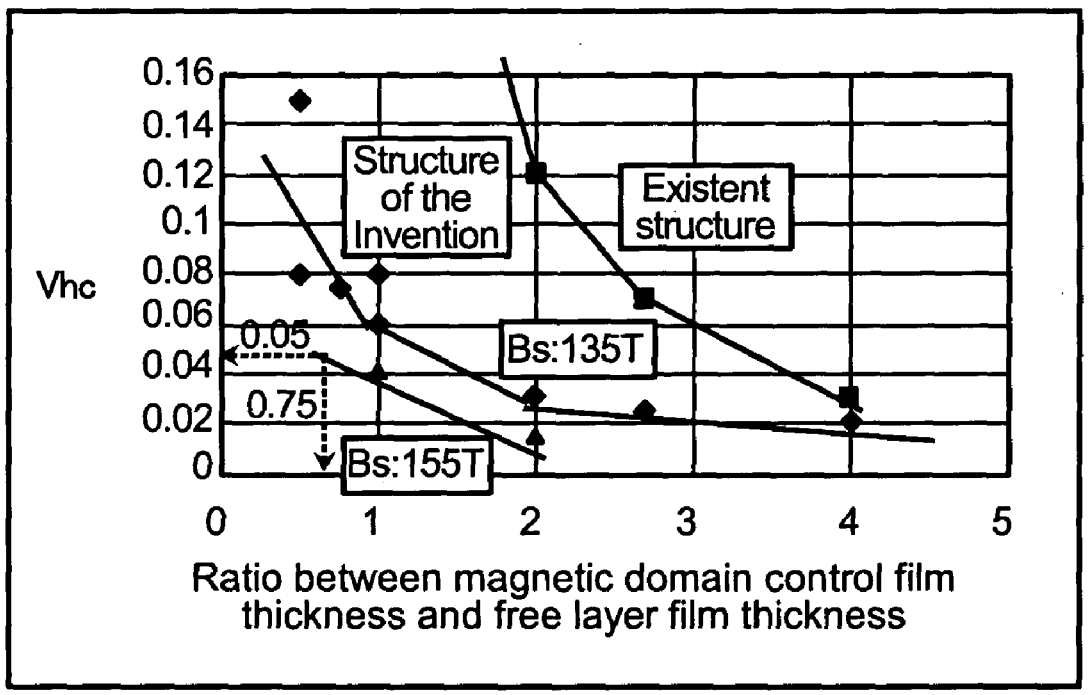

Then, an experiment for optimizing the bias magnetic field was carried out by changing the thickness of the CoCrPt alloy thin film to change the residual magnetization of Brt. The saturation magnetic flux density of the CoCrPt alloy thin film is 1.35 T. As the type for the free layer 7 of the stack of magnetoresistive layers, a laminate ferri-type free layer having a structure of CoFe film/Ru film/NiFe film with a total film thickness of 4.2 nm was used. Further, a resist was selected so as to provide 100 nm Twf equivalent to that in Embodiment 2. Further, two types of heads, that is, a head of a structure according to the present invention and a head of the existent structure were prototyped and Vhc and $\Delta R$ of the transfer curve were compared with each other. FIG. 14 shows the result thereof. The abscissa indicates the ratio between the magnetic domain control film thickness and the free layer film thickness.

In the case of the head of the existent structure, when the ratio between the magnetic domain control film thickness and the free layer thickness is less than 4, Vhc showing the deviation of the transfer curve increases extremely. On the contrary, in the structure according to the present invention, no large deviation is observed up to the ratio of 2 between the film thickness of the magnetic domain control film 11 and a film thickness of the free layer 7 in the structure according to the present invention. Further, as the film thickness decreases, the resistance change $\Delta R$ increases both in the cases of the present invention and the existent structure. Further, $\Delta R$ is larger in the case of the existent structure.

This shows that the bias magnetic field decreases as the ratio between the magnetic domain control film thickness and the free layer thickness decreases. Further, the resistance change coefficient is smaller in the present invention than in the existent structure at the same ratio between the magnetic domain control film thickness and the free layer film thickness and this shows that the effective bias magnetic field applied to the free layer 7 is more intense in the structure according to the present invention. Accordingly, it can be concluded that a bias voltage is applied more appropriately to the free layer in the structure according to the present invention compared with the existent structure.

Then, an experiment of changing the thickness of the magnetic domain control film was conducted while changing the CoCrPt alloy composition for the magnetic domain control film 11 and using the material composition showing the saturation magnetic flux density Bs of 1.55 T. In this case, the coercivity value was 1150 (Oe) and the squareness was 0.91. The Vhc value decreased in each of the cases where the ratios between the magnetic domain control film thickness and the free layer film thickness were 1 and 2. FIG. 14 shows that the ratio between the magnetic domain control film thickness and the free layer thickness can be reduced to 0.75 for use at a Vhc value of 0.05 or less. Accordingly, this shows that Vhc can be decreased in a case where the saturation magnetic flux density is high and the residual magnetic flux density is high. A localized bias magnetic field can be applied to the free layer by the method in a structure in which the film thickness of the magnetic domain control film is decreased, that is, a structure shown in FIG. 4, that is, in FIG. 2

Embodiment 5

The magnetic head can be prepared easily by combining a recording head to a reading head having the structure of the present invention. As described above for the present invention, the reading head of the present invention has a structure optimal to a head having a read track width of 200 nm or less and, particularly, about 100 nm, and a writing head corresponding to the narrow track width of the reading head is combined with the reading head to fabricate a magnetic head. This magnetic head is incorporated into a magnetic recording apparatus for high recording density and used for writing/reading signal information, and a magnetic recording apparatus is provided which has a low error reading rate for information resulting from the high signal quality.

Figure 15:
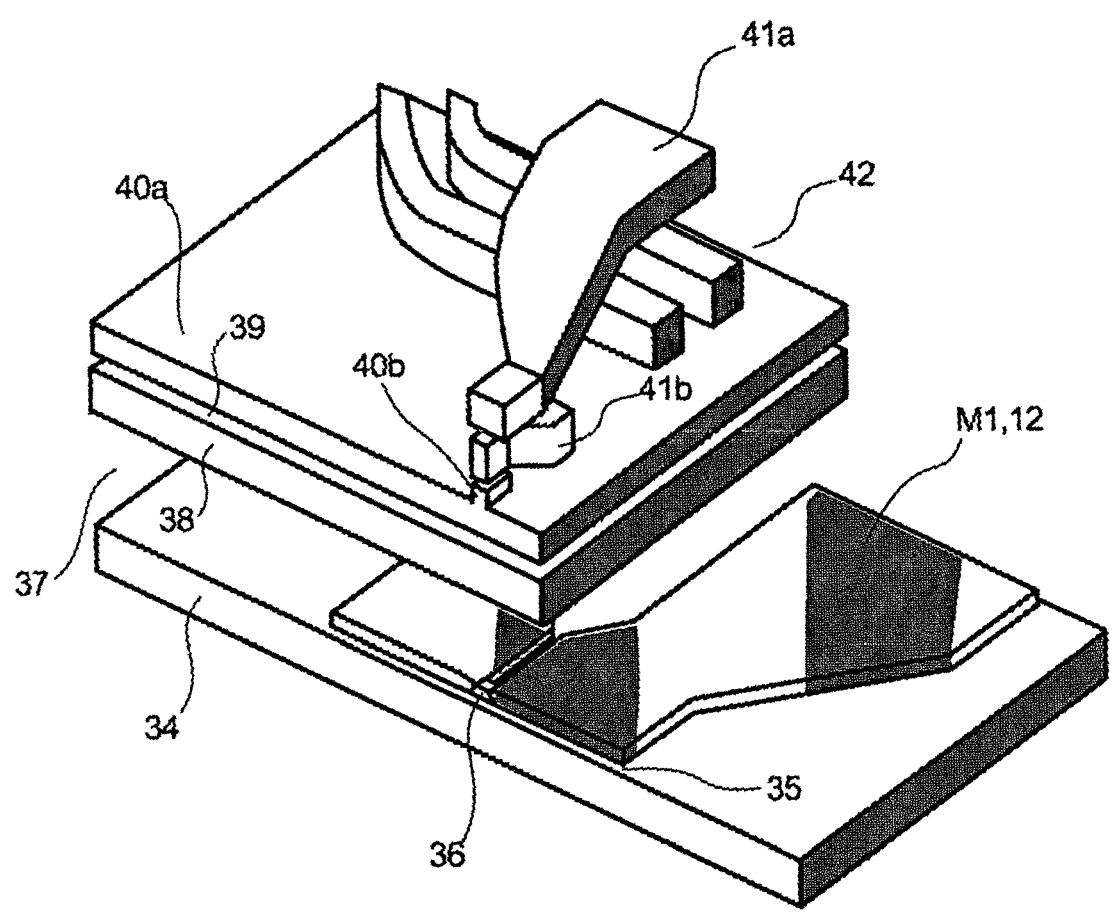
FIG. 15 is a schematic view of a magnetic head structure when a reading sensor provided in Embodiment 5 of the present invention is formed and then a writing head is formed to manufacture a magnetic head for demonstrating the present invention.

FIG. 15 shows an entire view of a magnetic head that incorporates a reading head having a magnetic domain control structure of the present invention. A stack of magnetoresistive layers 36 having a magnetoresistive effect is disposed by way of an insulative layer 35 on a lower shield 34, and stacks of magnetic domain control layers M1 are disposed adjacent to both the inclined ends of the stack of magnetoresistive layers. An electrode 12 is disposed on the stack of magnetic domain control layers. An upper shield 38 is disposed by way of an insulative layer 37 above the electrode 12. A lower magnetic pole 40a is disposed by way of an insulative layer 39 above the upper shield 38. A portion of the lower magnetic pole has a protruding structure 40b, which performs recording operation. Coils 42 and upper magnetic poles 41a, 41b are present above the lower magnetic pole 40a. The top end of the upper magnetic pole 41a has a structure recessed from the flying surface and retracted from the top end of the upper magnetic pole 41b. By dividing the upper magnetic pole into 41a and 41b as shown, magnetic fluxes generated in the magnetic pole by a current flowing through the coils 42 can be effectively collected to the top end portion, improving the recording characteristics. The writing head may be one for vertical recording having a main magnetic pole and an auxiliary magnetic pole.

A magnetic head corresponding to FIG. 15 was manufactured and magnetic recording operation was conducted to a magnetic recording medium to evaluate characteristics of read signals. As a result, it was confirmed that the read output intensity was increased and the signal noise were suppressed sufficiently.

Embodiment 6

There are known three types of a stack of magnetoresistive layers depending on the system of arranging the pinned layer and the free layer. That is, the stack of magnetoresistive layers is classified into three types: a bottom spin-valve film (BSV film) in which a pinned layer is disposed as a lower portion and a free layer is disposed as an upper layer by way of an non-magnetic layer; a top spin valve film (TSV film) in which a free layer is disposed as a lower portion and a pinned layer is disposed as an upper layer by way of a non-magnetic layer; and a dual spin valve film (DSV film) in which fixed layers are disposed as a lower portion and an upper portion respectively and a free layer is disposed as a central portion by way of a lower non-magnetic layer and an upper non-magnetic layer. They have their respective features.

Figure 16:
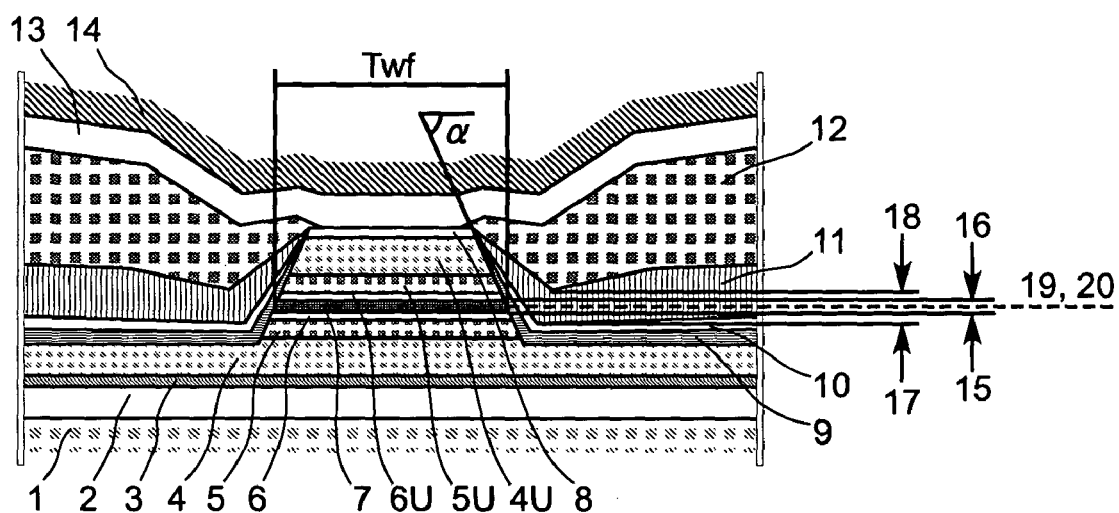
FIG. 16 is a schematic cross sectional view of Embodiment 6 of the present invention.

Embodiments 1, 2, 3, 4 and 5 are examples in a case where the structure of the stack of magnetoresistive layers is a bottom spin valve film. FIG. 16 shows a structure in a case where the stack of magnetoresistive layers is a dual spin valve film. In the dual spin valve film, since the layer developing the magnetoresistive effect is at a boundary between an upper portion and a lower portion of the free layer, it has a structure capable of increasing the magnetic resistance change coefficient and capable of easily obtaining symmetry of signal waveforms, so that the stack of magnetoresistive layers can be used for a magnetic disk drive requiring high signal quality.

The stack of magnetoresistive layers of a dual spin valve film shown in FIG. 16 has a structure in which an underlayer 3, a lower anti-ferromagnetic layer 4, a lower pinned layer 5, a lower non-magnetic layer 6, a free layer 7, an upper non-magnetic layer 6U, an upper pinned layer 5U, an upper anti-ferromagnetic layer 4U and a protection film layer 8 are formed in this order from the lower layer to the upper layer. In the same manufacturing method as the manufacturing method shown in FIG. 5, after applying a photoresist on the stack of magnetoresistive layers, etching is conducted as far as the lower anti-ferromagnetic layer by the ion beam etching method. Subsequently, a magnetic domain control film amorphous layer 9, a magnetic domain control underlayer 10, a magnetic domain control film layer 11, and an electrode film layer 12 are formed successively. The vertical positions of the free layer in the stack of magnetoresistive layers and the magnetic domain control film can be aligned with each other by adjusting the position of etching depth for etching during the beam etching and the film thickness of each of the magnetic domain control film amorphous layer 9, the magnetic domain control underlayer 10 and the magnetic domain control film layer 11. Further, the magnetic properties and the crystallographic orientation of the magnetic domain control film can be controlled by the method shown in Embodiments 2, 3 and 4, so that the magnetic domain control bias magnetic field can be optimized.

A head with the residual flux density being reduced to 100 G$\mu$m was prototyped by applying the magnetic domain control film of the structure described above to the dual spin valve film, and the effect for the improvement of the output and the effect of suppressing noise could be confirmed.

Embodiment 7

Figure 17:
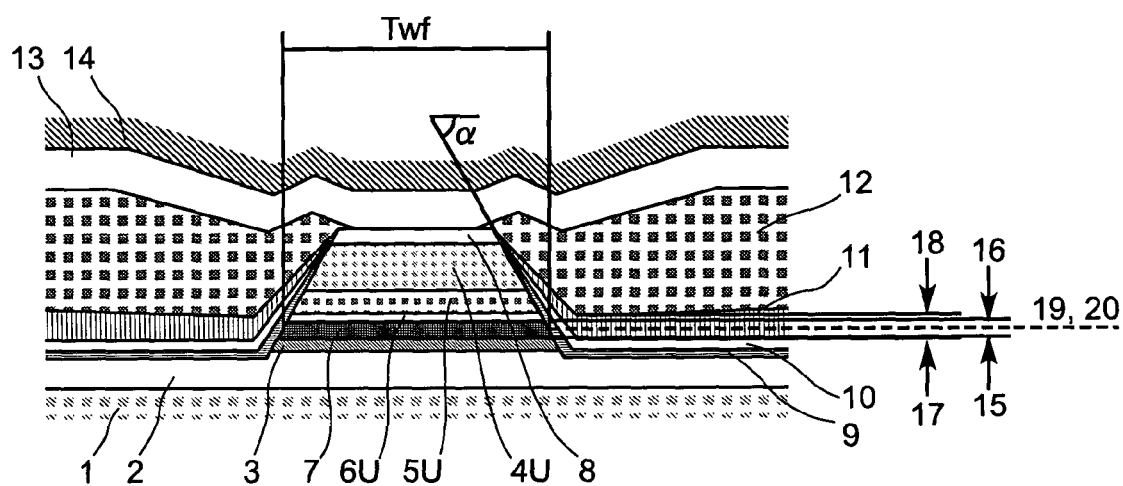
FIG. 17 is a schematic cross sectional view of Embodiment 7 of the present invention.

FIG. 17 shows a structure in which the stack of magnetoresistive layers is a top spin valve film. The stack of magnetoresistive layers of the top spin valve film in FIG. 17 has a structure in which an underlayer 3, a free layer 7, an upper non-magnetic layer 6U, an upper pinned layer 5U, an upper anti-ferromagnetic layer 4U and a protection film 8 are formed in this order from the lower layer to the upper layer. The magnetic domain control bias magnetic field can be optimized by the same manufacturing method and the structure of the stack of magnetic domain control layers as those in the bottom spin valve film or the dual spin valve film. That is, by the same manufacturing method as shown in FIG. 5, after applying a photoresist on the stack of magnetoresistive layers, etching is conducted as far as the lower gap layer 2 by an ion beam etching method. In this case, the etching depth may reach the underlayer 3 for the purpose of aligning the vertical positions of the free layer and the magnetic domain control film with each other. Then, a magnetic domain control film amorphous layer 9, a magnetic domain control film underlayer 10 and a magnetic domain control film layer 11 and an electrode film 12 are successively formed. The vertical positions of the free layer 7 of the stack of magnetoresistive layers and the magnetic domain control film 11 can easily be aligned with each other by adjusting the position for etching depth for etching during ion beam etching and the film thickness for each of the layers of the magnetic domain control film amorphous layer 9 and the magnetic domain control film underlayer 10 and the magnetic domain control film layer 11.

In a case of the top spin valve film structure, the free layer 7 is disposed at a lower portion near the lower gap film. Further, $Al_2O_3$ or $Al_2O_3=SiO_2$ amorphous insulative film is often used for the lower gap film. Further, magnetic properties of the CoCrPt alloy film and the Cr alloy underlayer used as the magnetic domain control film are obtained easily on the amorphous insulative film $Al_2O_3$ or $Al_2O_3=SiO_2$, and the crystallographic orientation is also in the state of State A1 in FIG. 6. Accordingly, this is a structure in which the Co alloy magnetic domain control film 11 of good magnetic properties can be easily disposed at a position in the vicinity of the free layer 7 even when the magnetic domain control amorphous film is not disposed and in which the alignment of the vertical positions is easy. However, it is estimated that the magnetic properties of the Co alloy magnetic domain control film present on the inclined surface at the end of the stack of magnetoresistive layers are lowered and it is easily estimated that the characteristic instability of the magnetic domain control film due to the inclined portion is not removed.

Then, reading heads with and without magnetic domain control amorphous layer in the top spin valve film were prepared and magnetic resistance transfer curve was measured to evaluate the magnetic domain control bias magnetic field. In this case, the residual magnetic flux density is 100 Gμm and the vertical positions of the free layer 7 and the magnetic domain control film 11 are aligned with each other. As a result, the Vhc value was 0.015 in a case where the magnetic domain control amorphous layer was present, whereas Vhc was 0.035 in a case of no magnetic domain control amorphous layer. Accordingly, it has been formed that the magnetic properties of the Co alloy magnetic domain control film 11 present in the portion of the slope gives an effect on the stability of the magnetic domain control bias magnetic field. In the existent system, the properties of the Co alloy magnetic domain control film cannot be improved in the inclined portion, and the characteristic instability of the magnetic domain control field in the inclined portion cannot be eliminated.

A head with the residual magnetic flux density being reduced to 100 Gμm was prototyped by applying the magnetic domain control film 11 of a structure of this embodiment to a top spin valve film to confirm the effect of improving the output and the effect of suppressing noise. The Co alloy magnetic domain control film 11 in this case has crystallographic orientation of State B in FIG. 6. It is probable, from the result of the experiment showing that the magnetic properties of the Co alloy magnetic film formed at the inclined portion of the stack of magnetoresistive layers and the crystallographic orientation of the Co alloy magnetic domain control film give effects on the stability of the magnetic domain control bias magnetic field, that the shape and the crystal orientation of the magnetic domain control film 11 have a strong correlation to determine the bias magnetic field. In the current technique, the shape of the Co alloy magnetic film formed to the inclined portion of the stack of magnetoresistive layers is in the shape of covering the free layer end and a shape of the Co alloy magnetic film completely disposed at the end of the free layer cannot be formed. In the case of the shape covering the end of the free layer at present, it is considered that the isometric orientation is preferred for the crystallographic orientation of the Co alloy magnetic domain control film.

If the shape of the magnetic domain control film can be optimized in the feature, it may be the possibility that the orientation of the C axis of the Co alloy film is preferably in the film plane for the crystallographic orientation of the Co alloy magnetic domain control film. Anyway, it is possible to control the crystallographic orientation of the Co alloy magnetic domain control film by the manufacturing method disclosed in the present invention and it is possible to optimize the magnetic domain control film structure.

As described above, by the use of the reading head having the magnetic domain control structure described above, it is possible to easily provide a magnetic head having high sensitivity and good noise properties and it is possible to easily supply a magnetic recording apparatus of high recording density.

Embodiments 6 and 7 describe the effectiveness in a case of applying the structure and the manufacturing method of the magnetic domain control film disclosed in the present invention in a case where the types of the stack of magnetoresistive layers are different from each other. On the other hand, development of the utilizing the TMR effect or development of the stack of magnetoresistive layers of new structure has been progressed rapidly in recent years. The main purpose of the present invention concerns a structure of applying an optimal magnetic domain control bias magnetic field to the free layer of the stack of magnetoresistive layers having at least the pinned layer and the free layer, and the present invention is applicable to various magnetic domain control systems of the stacks of magnetoresistive layers. Accordingly, it should be recognized that the present invention is a useful technique that can be applied easily to the stack of magnetoresistive layers of the TMR system or to the stack of magnetoresistive layers having a pinned layer with no anti-ferromagnetic material.

By the use of the magnetic domain control system for the free layer of the magnetoresistive head as in the present invention, it is possible to attain a magnetoresistive head having good noise properties and high stability while possessing high sensitivity also to a narrow stack as compared with the device of the existent magnetic domain control method.

What is claimed is:

1. A magnetoresistive sensor comprising:
    a magnetoresistive stack layer including a first antiferromagnetic layer, a first pinned layer, a first nonmagnetic layer, and a free layer;
    a first underlayer of said magnetoresistive stack layer;
    a magnetic domain control film; and
    a pair of electrode films for supplying current to said magnetoresistive stack layer;
    a second underlayer formed below said magnetic domain control film; and
    an amorphous metal film layer formed below said second underlayer for controlling a crystallization of said second underlayer,
    wherein a center position of an upper surface and a lower surface of said magnetic domain control film is positioned within a range of an upper surface and a lower surface of said free layer, and
    wherein said second underlayer is formed of Cr or Cr alloy and comprises a body-centered cubic lattice (BCC) polycrystal thin film, and polycrystal orientation of said second underlayer against a formed plane thereof is isometric random crystal orientation having no particular crystal orientation.

2. A magnetoresistive sensor according to claim 1,
wherein said magnetoresistive stack layer further comprises a protection layer, and
wherein said first underlayer, said first anti-ferromagnetic layer, said first pinned layer, said first non-magnetic layer, said free layer and said protection layer are formed in order.

3. A magnetoresistive sensor according to claim 1, wherein said amorphous metal film layer is formed on any one of surfaces within a range from a lower surface of said second underlayer to an upper surface of said first non-magnetic layer.

4. A magnetoresistive sensor according to claim 1, wherein a lower surface of said free layer is aligned with a lower surface of said magnetic domain control film, and a bias magnetic field of said magnetic domain control film is mainly applied to said free layer.

5. A magnetoresistive sensor according to claim 1, wherein said magnetic domain control film is formed of a Co alloy film, said second underlayer controls a crystallization state of said magnetic domain control film, and said amorphous metal film layer controls a crystallization state of said second underlayer.

6. A magnetoresistive sensor according to claim 1, wherein said magnetic domain control film is formed of a Co alloy film, said second underlayer is formed of a Cr or Cr alloy film, and said amorphous metal film layer is formed of an Ni series alloy or Co series alloy film.

7. A magnetoresistive head constituted by using a magnetoresistive sensor according to claim 1.

* * * * *